(12) United States Patent
Tsai et al.

(10) Patent No.: US 11,545,432 B2
(45) Date of Patent: Jan. 3, 2023

(54) SEMICONDUCTOR DEVICE WITH SOURCE AND DRAIN VIAS HAVING DIFFERENT SIZES

(71) Applicant: Taiwan Semiconductor Manufacturing Co., Ltd., Hsin-Chu (TW)

(72) Inventors: Kuo-Chiang Tsai, Hsinchu (TW); Yi-Ju Chen, Tainan (TW); Jyh-Huei Chen, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 17/083,976

(22) Filed: Oct. 29, 2020

(65) Prior Publication Data

US 2021/0272901 A1 Sep. 2, 2021

Related U.S. Application Data

(60) Provisional application No. 62/982,239, filed on Feb. 27, 2020.

(51) Int. Cl.
*H01L 23/528* (2006.01)
*H01L 23/522* (2006.01)
(Continued)

(52) U.S. Cl.
CPC .... *H01L 23/5283* (2013.01); *H01L 21/76816* (2013.01); *H01L 21/823431* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 23/5283; H01L 23/5286; H01L 23/5226; H01L 21/76816; H01L 21/76895; H01L 21/76897;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Younes Boulghassoul
(74) *Attorney, Agent, or Firm* — Haynes and Boone, LLP

(57) ABSTRACT

An exemplary semiconductor device includes a source feature and a drain feature disposed over a substrate. The semiconductor device further includes a source via electrically coupled to the source feature, and a drain via electrically coupled to the drain feature. The source via has a first size; the drain via has a second size; and the first size is greater than the second size. The semiconductor device may further include a first metal line electrically coupled to the source via and a second metal line electrically coupled to the drain via. The source via has a first dimension matching a dimension of the first metal line, and the drain via has a second dimension matching a dimension of the second metal line. The first metal line may be wider than the second metal line.

20 Claims, 26 Drawing Sheets

(51) Int. Cl.
*H01L 27/02* (2006.01)
*H01L 29/417* (2006.01)
*H01L 29/08* (2006.01)
*H01L 29/78* (2006.01)
*H01L 21/8234* (2006.01)
*H01L 21/768* (2006.01)

(52) U.S. Cl.
CPC .. *H01L 21/823475* (2013.01); *H01L 23/5226* (2013.01); *H01L 27/0207* (2013.01); *H01L 21/76897* (2013.01); *H01L 21/823418* (2013.01); *H01L 29/0847* (2013.01); *H01L 29/41791* (2013.01); *H01L 29/7848* (2013.01)

(58) Field of Classification Search
CPC ..... H01L 21/823475; H01L 21/823871; H01L 29/41733; H01L 29/41725; H01L 23/528; H01L 21/823418; H01L 21/823814; H01L 29/0847; H01L 29/7848
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2019/0067131 A1* | 2/2019 | Liaw | H01L 21/76816 |
| 2020/0035605 A1* | 1/2020 | Tsai | H01L 23/5283 |
| 2020/0044071 A1* | 2/2020 | Huang | G06F 30/398 |
| 2020/0058651 A1* | 2/2020 | Liaw | H01L 27/0924 |
| 2020/0058785 A1* | 2/2020 | Tsai | H01L 21/76897 |
| 2021/0028304 A1* | 1/2021 | Jeong | H01L 29/41725 |

\* cited by examiner

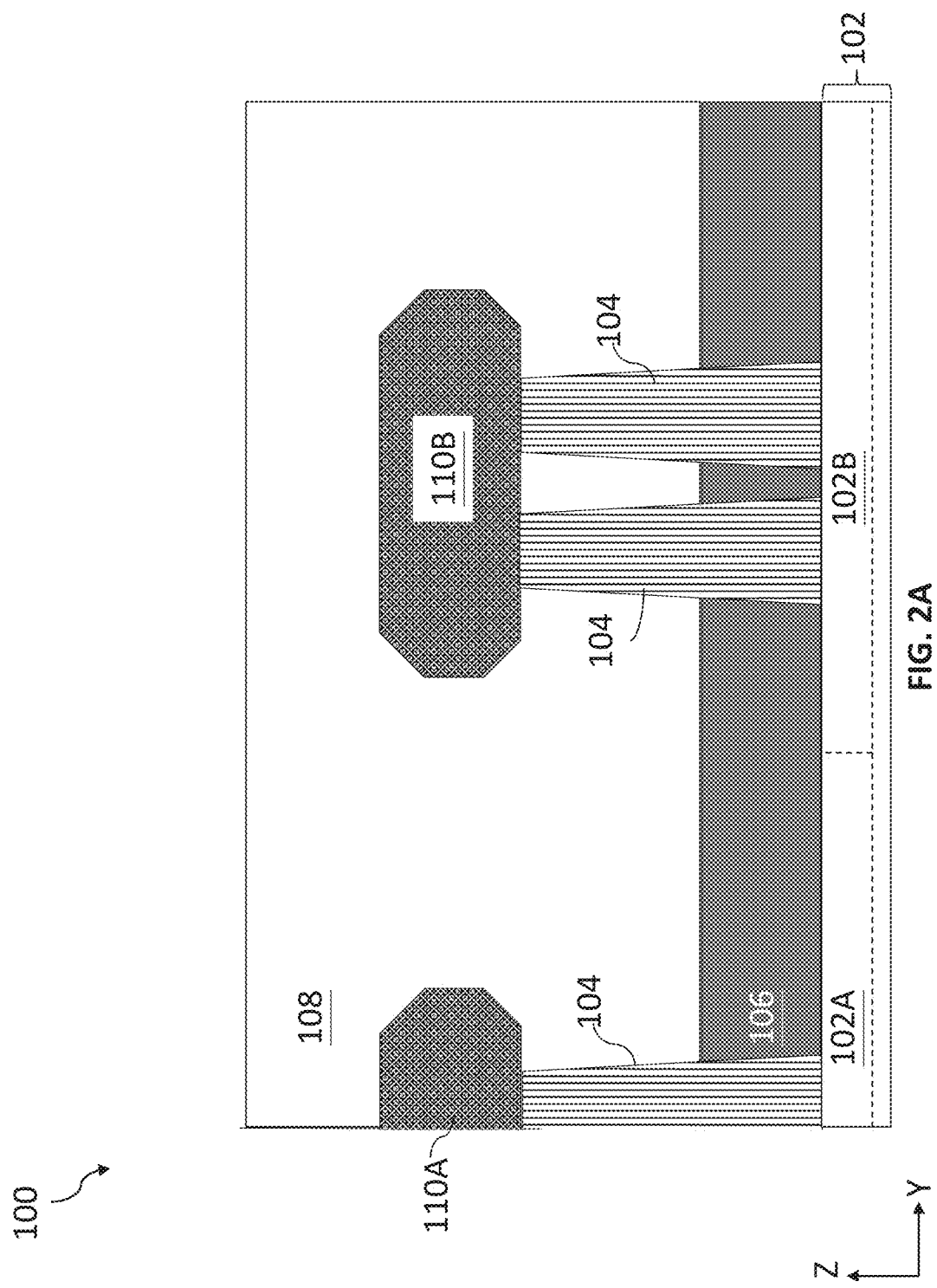

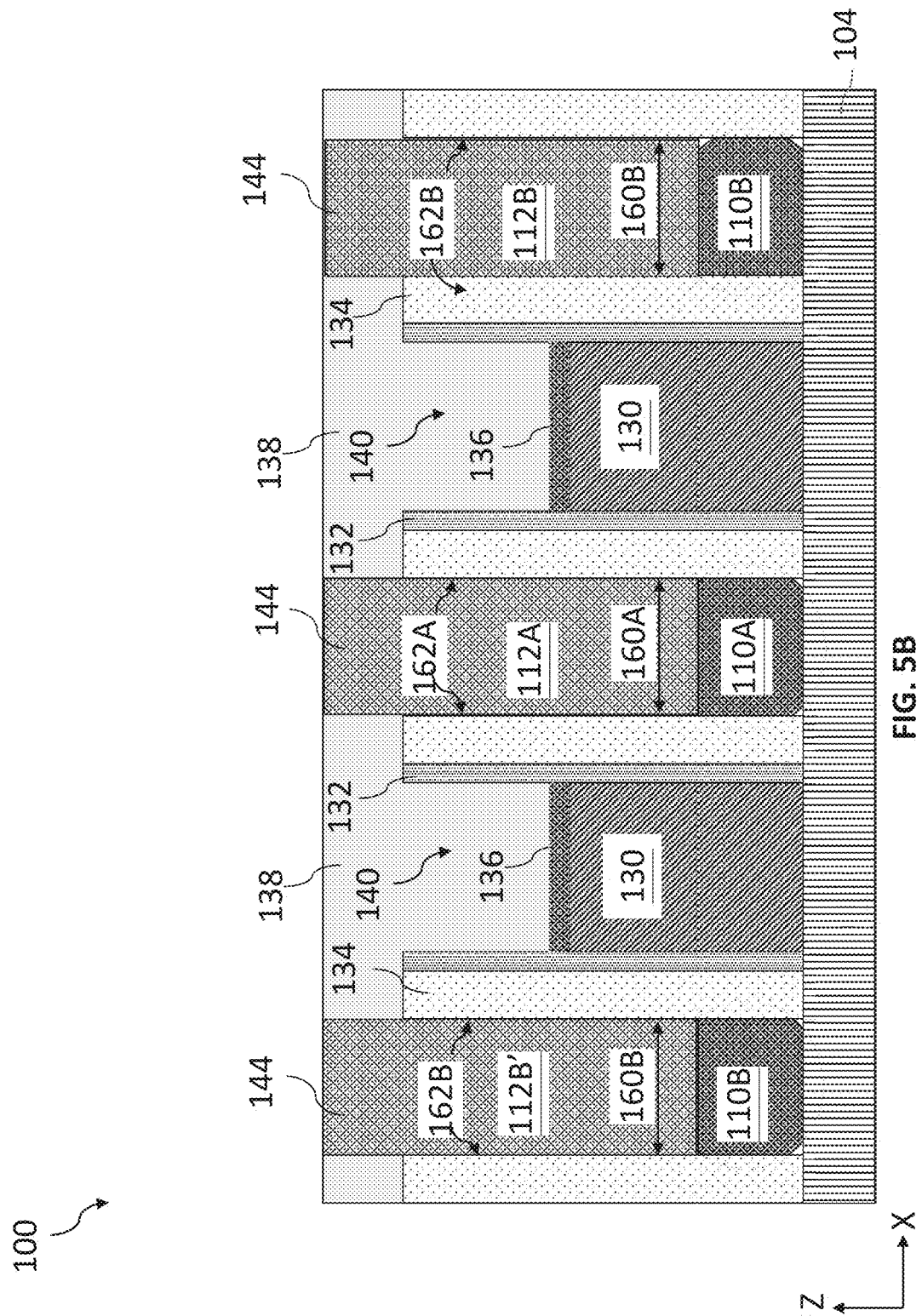

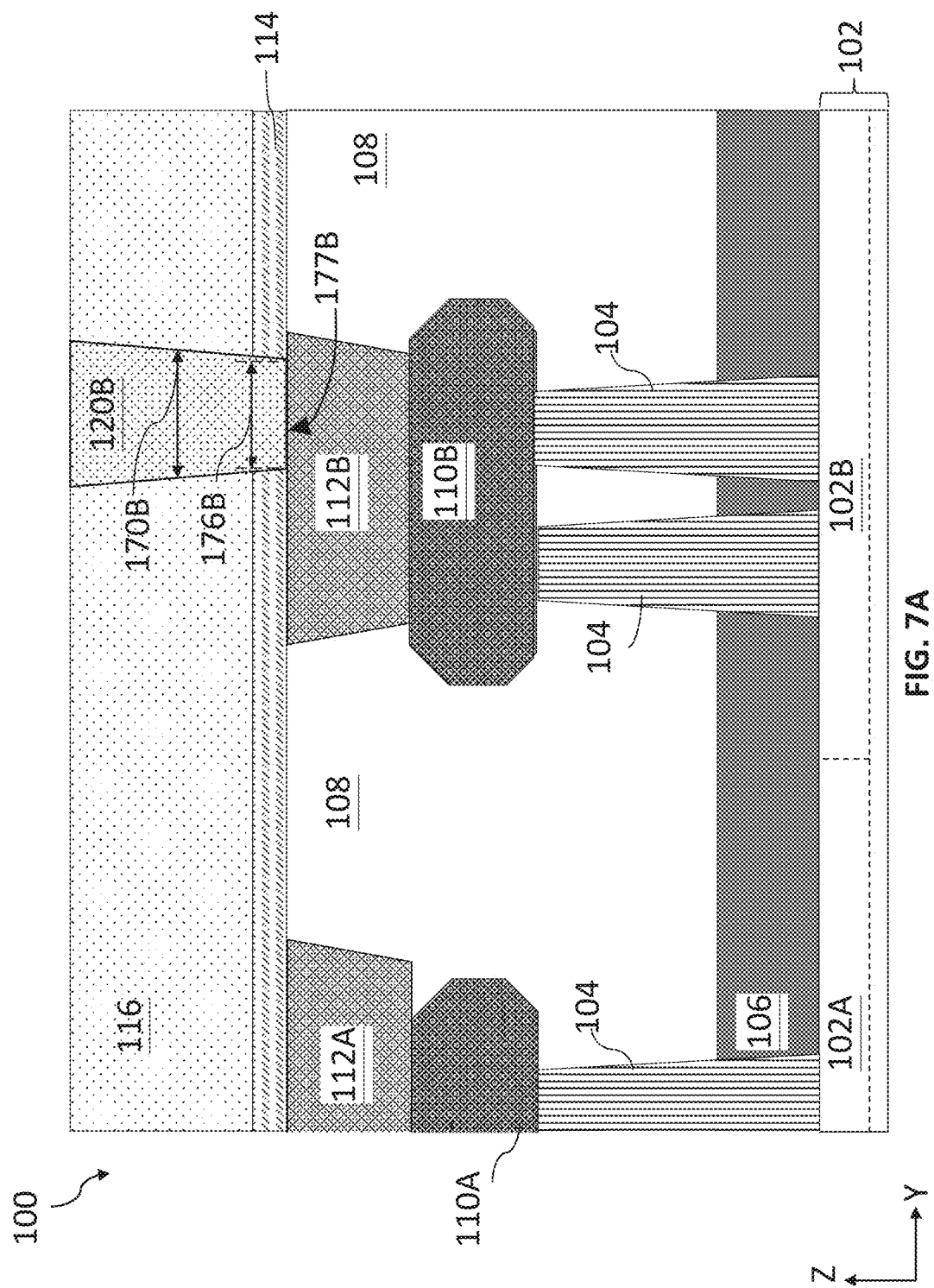

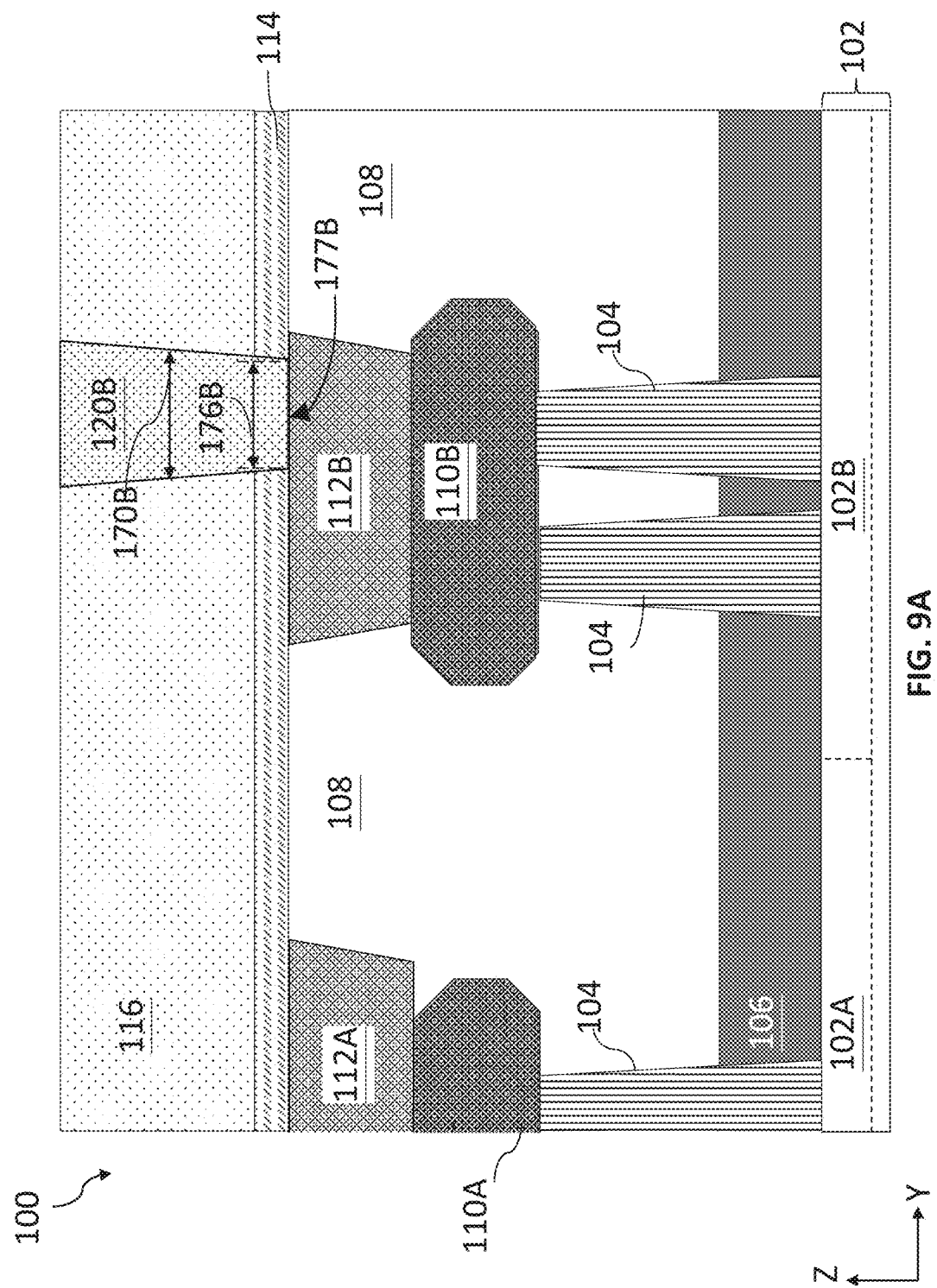

SEMICONDUCTOR DEVICE WITH SOURCE AND DRAIN VIAS HAVING DIFFERENT SIZES

PRIORITY DATA

The present application is a utility application of provisional U.S. patent application 62/982,239, filed on Feb. 27, 2020, entitled "Improved Via Structures," the disclosure of which is hereby incorporated by reference in its entirety.

BACKGROUND

The integrated circuit (IC) industry has experienced exponential growth. Technological advances in IC materials and designs have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, it is understood that via landings on source/drain contact and metal lines may suffer high resistances. Such high resistances are particularly problematic for smaller technology nodes as it may negate any improvement in performance due to the reduced node size. Accordingly, although existing interconnect technologies are generally adequate for their intended purposes, they are not satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-12A and 2B-12B are cross-sectional views of various embodiments of an IC device at various stages of fabrication according to various aspects of the present disclosure.

DETAILED DESCRIPTION

Figure 1A:
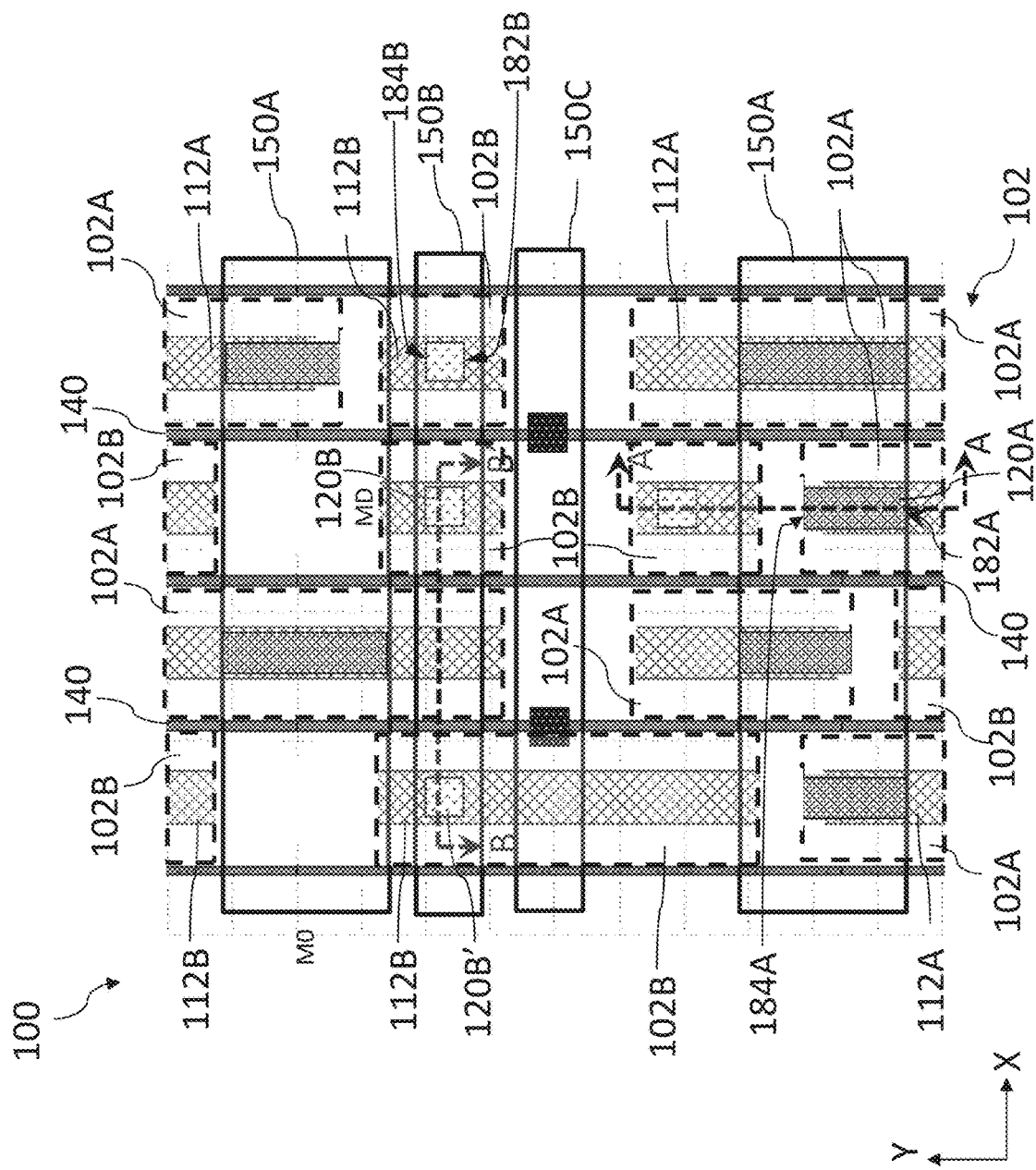
FIG. 1A is a plan view of an IC device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," "approximately," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices and methods of forming the same. More particularly, the present disclosure is related to semiconductor devices with reduced contact resistances (Rc). One aspect of the present disclosure involves forming improved via structures that has reduced contact resistances. As semiconductor fabrication progresses to ever smaller technology nodes, the overall contribution made by contact resistances may begin to seriously degrade device performance, such as device speed. In that regard, contact resistance generally reduces when the contact surface area increases. Therefore, it may be helpful to increase the via structure sizes to achieve larger contact surface areas—as long as such increase does not lead to an excessively large chip footprint that could impede the overall goal of downscaling. This disclosure recognizes that the effect of via structure sizes on the contact surface area and on the chip footprint is different between the source side and the drain side. For example, metal lines that connect to the via structures on the source side are usually wider than the metal lines that connect to the via structure on the drain side. Therefore, while the contact surface area on the source side is often determined by the via structure dimensions, contact surface area on the drain side is often limited to the metal line width, regardless of via structure dimensions. In other words, a larger via structure on the source side may reduce the resistance, but a similarly sized via structure on the drain side may have no effect on resistance and disadvantageously increase chip footprints. Accordingly, it may be beneficial to form asymmetric via structures on source and drain sides of the transistors. For example, the device may have a via structure that is greater in size on the source side than on the drain side. Unfortunately, conventional methods of forming via structures are not amenable to fabricate such asymmetric via structures. To overcome the problems discussed above, the present disclosure decouples the fabrications of the source side via structures and the drain side via structures.

FIG. 1A illustrates a plan view of an IC device 100 (for example, in an X-Y plane) according to various aspects of the present disclosure. The X-Y plane is a plane defined by the X-direction and the Y-direction. In that regard, X-direction and Y-direction are horizontal directions that are perpendicular to each other; and the Z-direction is a vertical direction perpendicular to the X-Y plane. As illustrated in the figures below, the IC device 100 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, the IC device 100 may apply to three-dimensional FinFET devices, as well as to planar FET devices.

As illustrated in FIG. 1A, the IC device 100 includes a substrate 102. The substrate 102 includes various doped regions. The IC device 100 also includes active regions and isolation structures (described in more detail below) formed in or on the substrate 102. Additionally, the IC device 100 also includes gate structures 140 formed over the active regions.

The gate structures 140 extend lengthwise in parallel with each other and along the Y-direction. The gate structures each separates the doped regions into a source region 102A and a drain region 102B. Source features 110A are formed over the fin structures 104 in the source regions 102A; and drain features 110B are formed over the fin structures 104 in the drain regions 102B. Source features 110A and drain features 110B are not illustrated in FIGS. 1A-1C as they may be covered by other features of the device. However, these features are clearly illustrated in subsequent figures. In some embodiments, the source features 110A and drain features 110B may include epitaxial layers (or epi-layers) that are epitaxially grown in the active regions. Accordingly, source features 110A are interchangeably referred to as epitaxial source features 110A; and drain features 110B are interchangeably referred to as epitaxial drain features 110B.

Figure 1B:
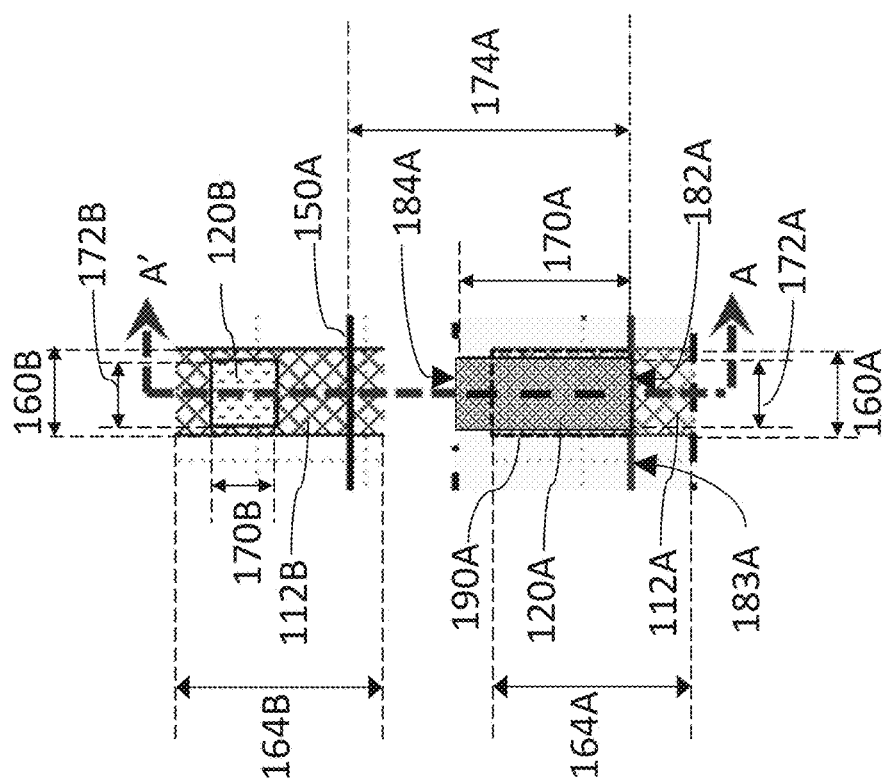
FIGS. 1B and 1C are expanded views of portions of the IC device of FIG. 1A according to various aspects of the present disclosure.
Figure 1C:
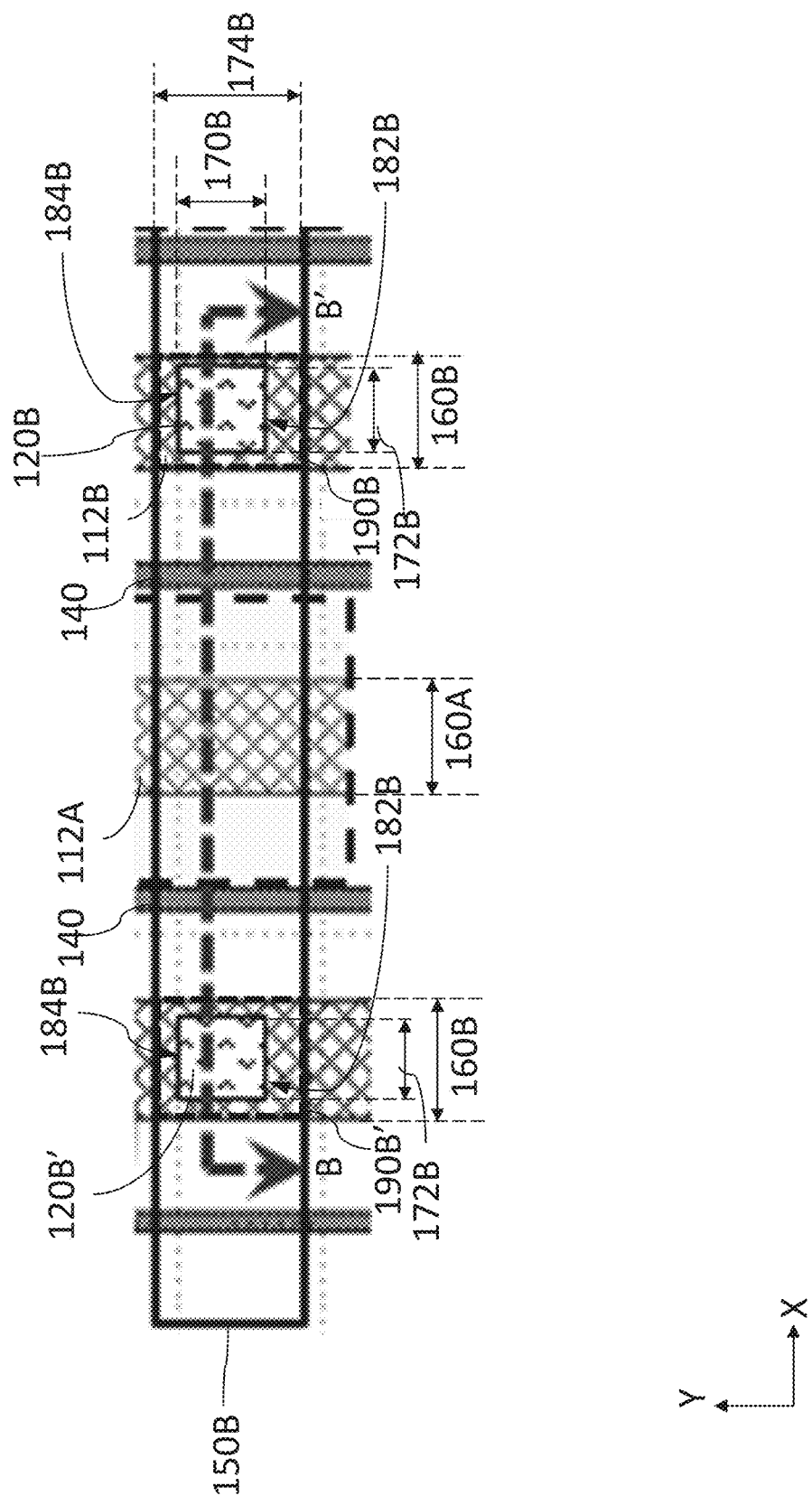

The IC device 100 further includes various contact features (such as source/drain contact features MD) formed on the source features 110A and the drain features 110B. For example, source contacts 112A are formed on source features 110A, and drain contacts 112B and 112B' are formed on drain features 110B. Moreover, the IC device includes via structures formed on source contact contacts 110A and drain contacts 110B. For example, source vias 120A are formed on source contacts 112A, and drain vias 120B are formed on drain contacts 112B and 112B'. In some embodiments, the source vias 120A have a larger size than the drain vias 120B. For example, the contact surface area between the source vias 120A and the source contacts 112A is larger than the contact surface area between the drain vias 120B and the drain contacts 112B and 112B'. Furthermore, the IC device includes metal lines 150 (such as metal lines 150A that connects to the source features and metal lines 150B that connects to the drain features) formed on the various via structures. In some embodiments, the source vias 120A have a larger contact surface area with the metal lines than the drain vias 120B do, because of the larger sizes of the source vias 120A. As described in detail below, the larger contact surface area on the source side reduces the contact resistance $R_c$ and improves device performances. These contact features, via structures, and metal lines form part of a multilayer interconnect (MLI) structure that electrically connects the source features 110A and drain features 110B to various other components of the IC device 100 and/or external voltages. Due to space considerations, FIG. 1A does not specifically illustrate all features of the IC device 100. Certain features are illustrated in detail in subsequent FIGS. 2A-12A and 2B-12B. In that regard, FIGS. 2A-12A and 2B-12B are cross-sectional views of the IC device 100 where the cross-sections are taken along the dashed line A-A' and B-B', respectively, as illustrated in FIG. 1A. Additionally, FIGS. 1B and 1C are expanded views of portions of FIG. 1A illustrating features relevant to FIGS. 2A-12A and 2B-12B. These cross-sectional views should be read in conjunction with the FIGS. 1A, 1B, and 1C. Additionally, FIG. 13 is a flowchart illustrating a method of forming the IC device 100.

Figure 2B:
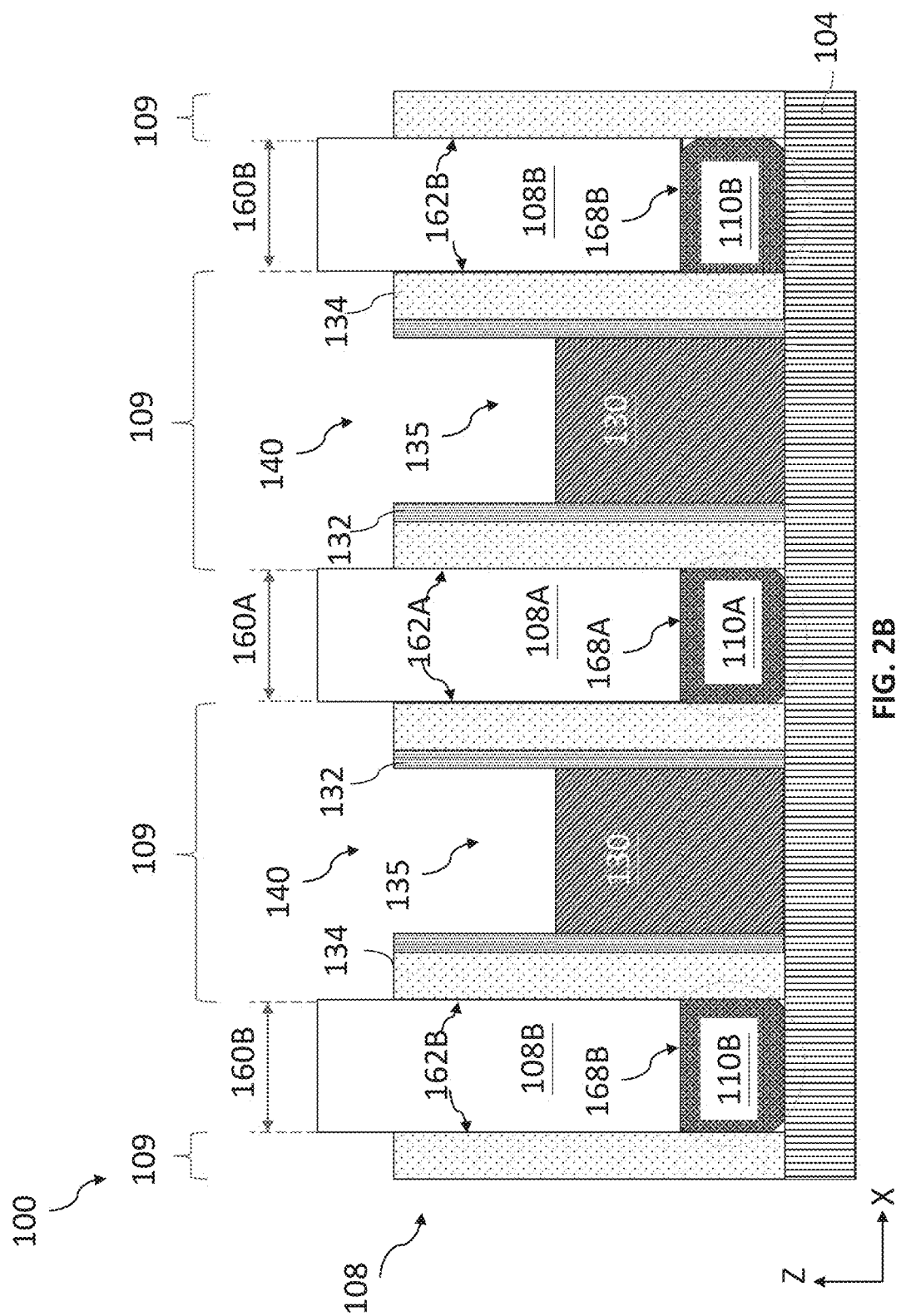
Figure 13:
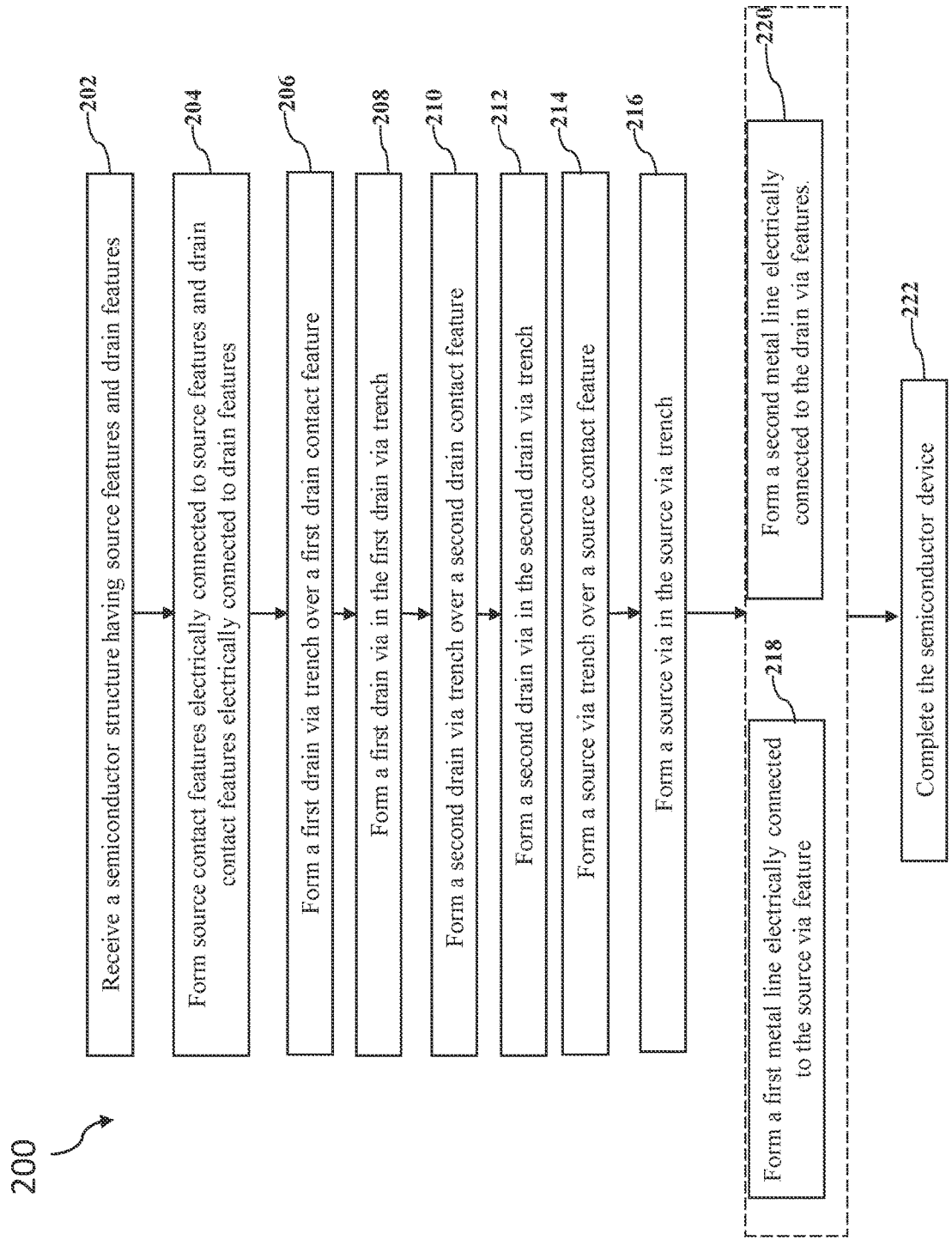
FIG. 13 is a flowchart of a method of fabricating a semiconductor device according to various aspects of the present disclosure.

Referring to FIGS. 2A and 2B and block 202 of FIG. 13, an initial structure of the IC device 100 is received. The initial structure includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer. In another example, the substrate 102 may include a conductive layer, a semiconductor layer, a dielectric layer, other layers, or combinations thereof. As indicated above, various doped regions (such as source regions 102A and drain regions 102B) may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

The initial structure of the IC device 100 also includes active regions 104. In some embodiments, the active regions 104 are elongated fin-like structures that protrude upwardly out of the substrate 102 (for example, along the Z-direction). As such, the active regions 104 may be interchangeably referred to as fins 104 or fin structures 104 hereinafter. The fin structures 104 are oriented lengthwise along the X-direction (such as substantially perpendicular to the gate structures 140). The fin structures 104 may be fabricated using suitable processes including photolithography and etch processes. The photolithography process may include forming a photoresist layer overlying the substrate 102, exposing the photoresist to a pattern, performing post-exposure bake processes, and developing the photoresist to form a masking element (not shown) including the resist.

The masking element is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 104.

The initial structure of the IC device 100 further includes the isolation structures 106. The isolation structures 106 electrically separate various components of the IC device 100. The isolation structures 106 may include silicon oxide, silicon nitride, silicon oxynitride, fluoride-doped silicate glass (FSG), a low-k dielectric material, and/or other suitable materials. In some embodiments, the isolation structures 106 may include shallow trench isolation (STI) features. In one embodiment, the isolation structures 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 106. Alternatively, the isolation structures 106 may include a multilayer structure, for example, having one or more thermal oxide liner layers.

Gate structures 140 are formed over the fin structures 104. Gate structures 140 define source regions and drain regions on two sides. The gate structures 140 may include gate stacks 130 and gate spacers adjacent the gate stacks 130. The gate stacks 130 may be dummy gate stacks (e.g., containing an oxide gate dielectric and a polysilicon gate electrode), or they may be high-k metal gate (HKMG) stacks that contain a high-k gate dielectric and a metal gate electrode, where the HKMG structures are formed by replacing the dummy gate structures. In some embodiments, the gate spacers include multiple layers. For example, layer 132 is formed directly on sidewalls of the gate stack 130, and layer 134 formed on sidewalls of the layer 132. Layer 132 may include any suitable materials. For example, layer 132 may include a material having a k value of about 7. For example, layer 132 may include silicon nitride (SiN). Layer 134 may be a gate spacer layer. For example, layer 134 may include a low-k material (such as those having a k value less than about 5). Though not depicted herein, the gate structure 140 may include additional material layers, such as an interfacial layer over the fin structures 104, hard mask layer(s) disposed over the gate structures 140, a capping layer, other suitable layers, or combinations thereof. In some embodiments, as illustrated in FIG. 2B, the gate stack 130 has been etched back such that a top surface of the gate stack 130 extends below a top surface of the gate spacers 132 and/or 134. In other words, trenches 135 are formed over the gate stacks 130 and between the gate spacers 132.

The initial structure of the IC device 100 additionally includes source features 110A formed in the source regions and drain features 110B formed in the drain regions. In some embodiments, the fin structures 104 are recessed in the source regions and the drain regions (for example, the regions not covered by the gate structures 140). Subsequently, source features 110A and drain features 110B are formed over the recessed fin structures 104 by any suitable methods, such as epitaxial growth methods. In some embodiments, the source features 110A and/or drain features 110B are formed over (or "merges over") two recessed fin structures 104.

The initial structure of the IC device 100 also includes an interlayer dielectric (ILD) layer 108 over the isolation structures 106, such that the top portions of the fin structures 104 are embedded within the ILD layer 108. Moreover, the gate structures 140, the source features 110A and the drain features 110B are also at least partially embedded within the ILD layer 108. The ILD layer 108 may include any suitable materials, such as SiCN, SiOCN, SiON, metal oxides, or combinations thereof.

In some embodiments, the ILD layer 108 includes a plurality of portions, such as portions 108A over the source features 110A and portions 108B over the drain features 110B. In some embodiments, the portions 108A and 108B are separated by trenches 109 from one another, and may be defined by sidewall surfaces of the gate spacer layer 134 (such as the sidewall surfaces 162A and 162B facing away from the gate stacks 130). In some embodiments, the source features 110A has an interface 168A with the ILD layer 108; and the drain features 110B has an interface 168B with the ILD layer 108. The interfaces 168A and 168B are also the top surface of the respective source features 110A and drain features 110B. Accordingly, they are interchangeably referred to as top surfaces 168A and 168B, respectively. In some embodiments, the sidewall surfaces 162A and 162B extend from the perimeter (or at least the outer edges along the X-direction) of the top surface 168A of the source feature 110A and the perimeter (or at least the outer edges along the X-direction) of the top surface 168B of the drain feature 110B, respectively. Accordingly, the widths of the portions 108A and 108B approximately match the widths of the interfaces 168A and the widths of the interfaces 168B, respectively, along the X-direction. In some embodiments, the portions 108A each has a width 160A along the X-direction; and the portions 108B each has a width 160B along the X-direction. As described in more detail below, widths 160A and 160B largely determine the widths of subsequently formed source contact and drain contact dimension along the X-direction, respectively. In some embodiments, the widths 160A and 160B are substantially the same.

Figure 3A:
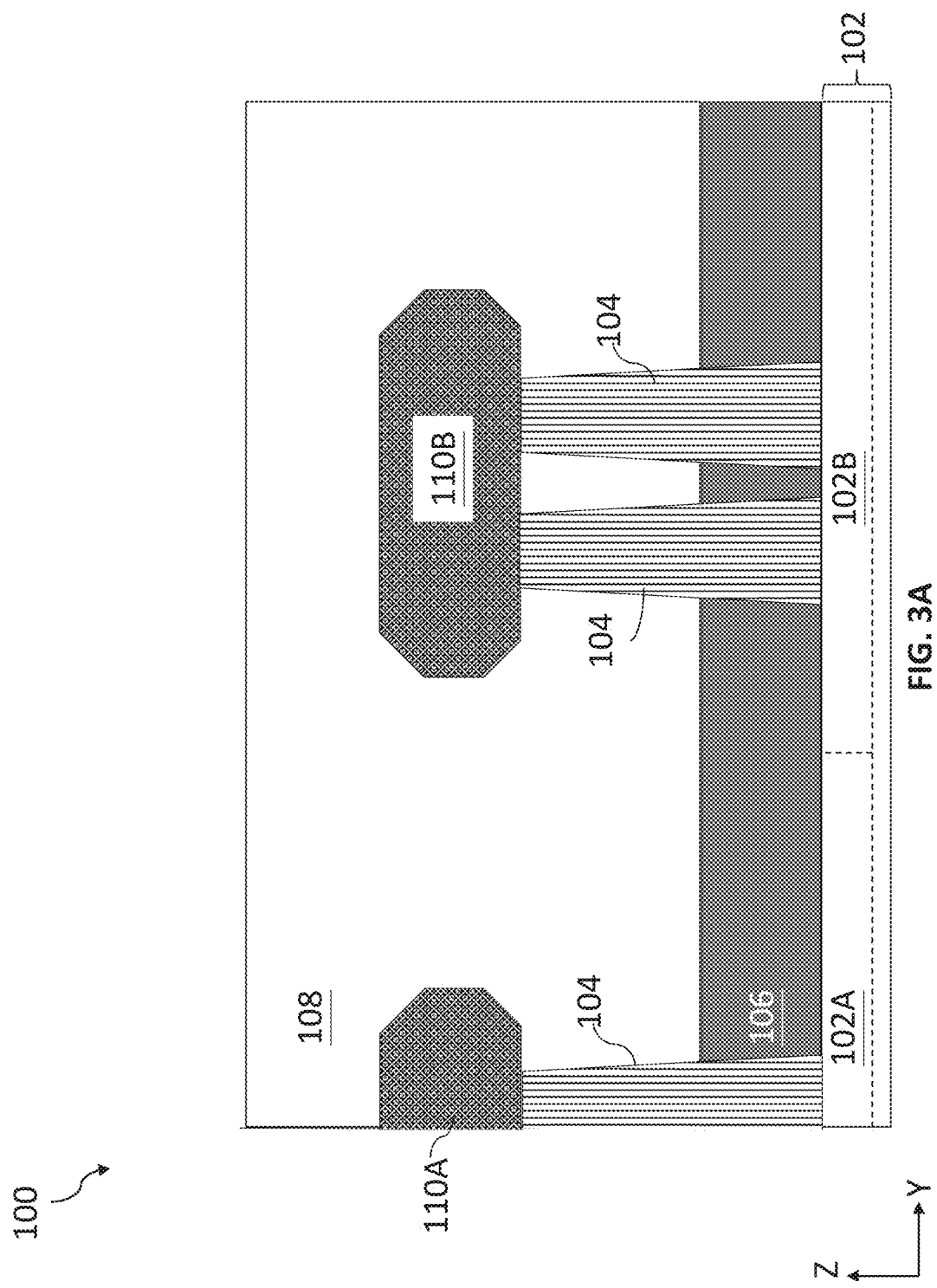
Figure 3B:
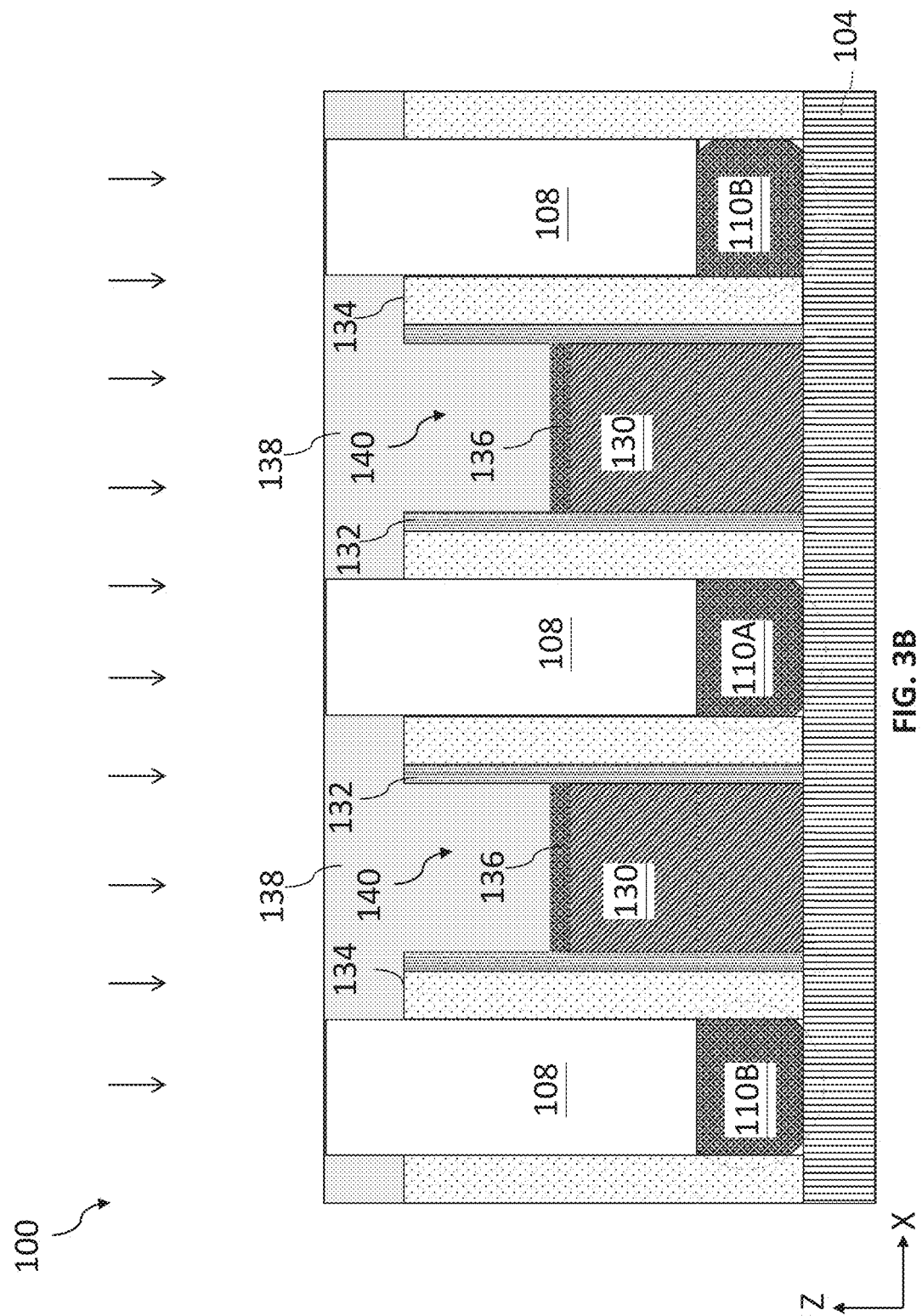

Referring to FIGS. 3A and 3B, a metal layer (metal-1) 136 is deposited into the trenches 135, such that the metal layer 136 partially fills the trenches 135. In some embodiments, the metal layer is a tungsten (W) layer. The metal layer 136 may include any suitable materials, and may be deposited by any suitable methods, such as CVD, PVD, ALD, HDPCVD, MOCVD, RPCVD, PECVD, LPCVD, ALCVD, APCVD, or combinations thereof. Moreover, a hard mask layer 138 is deposited over the metal layer 136 to fill the remaining portions of the trenches 135, such that a top surface of the hard mask layer 138 extends above a top surface of the spacer layers 132 and 134, as well as along or above a top surface of the ILD layer 108. In some embodiments, a Chemical Mechanical Polishing process may be employed to remove excess hard mask material over the ILD layer 108 and planarize the top surface. In some embodiments, the hard mask layer 138 may be used as an etching mask in subsequent etching processes. Hard mask layer 138 also protects the gate stacks in such etching processes.

Figure 4A:
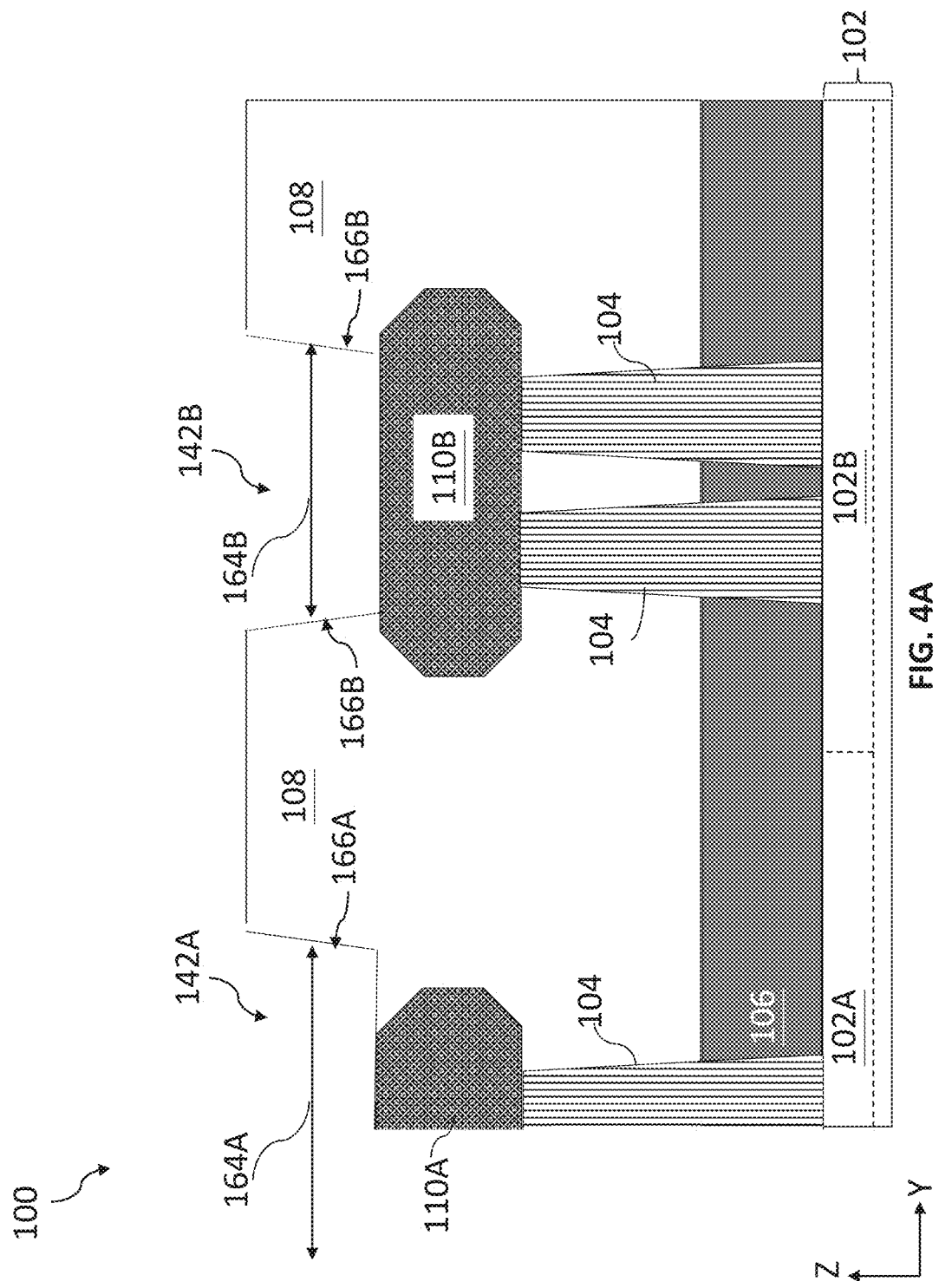
Figure 4B:
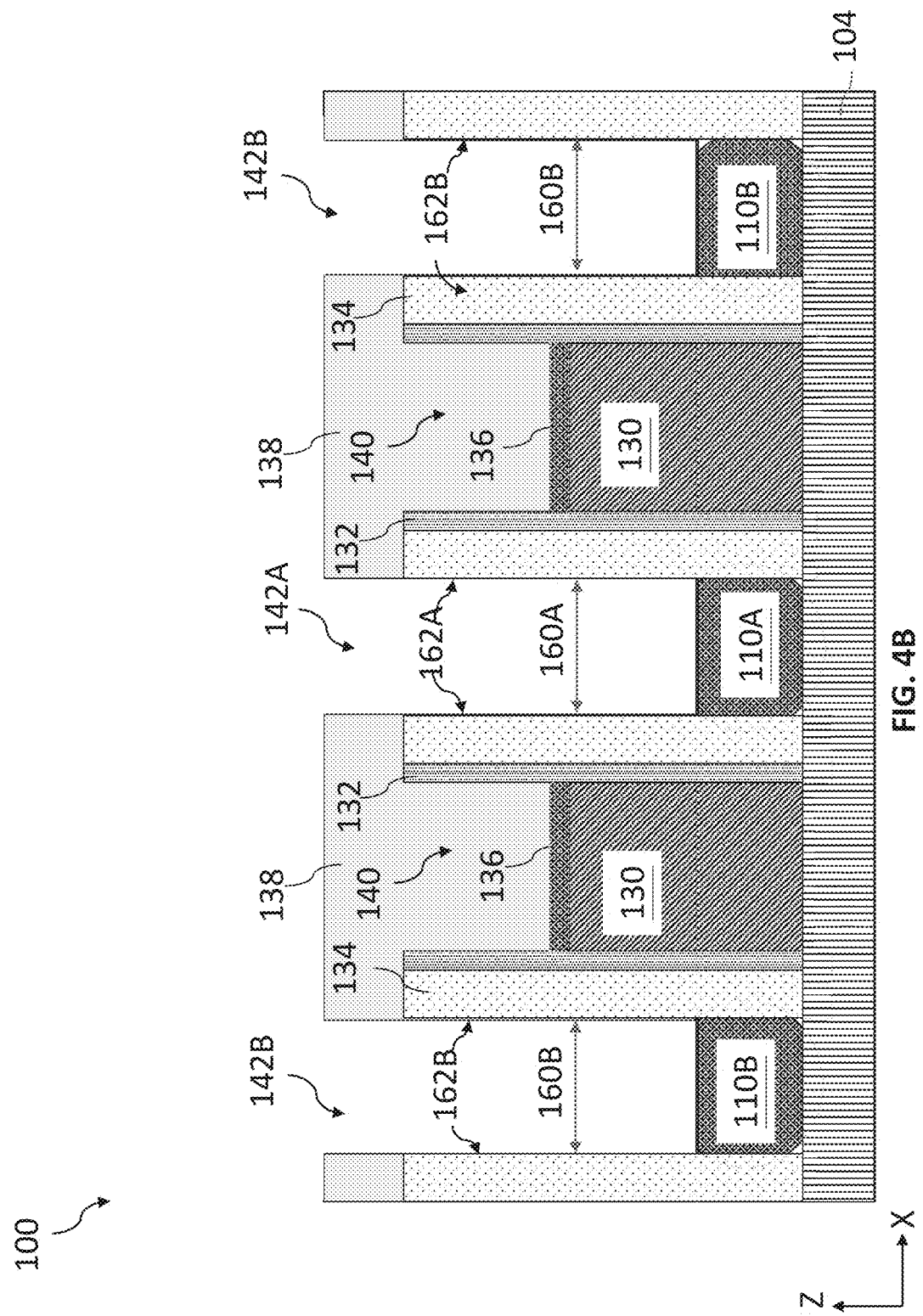

Referring to FIGS. 4A and 4B and block 204 of FIG. 13, an etching process is employed to remove portions 108A and 108B of the ILD 108 such that the source features 110A and the drain features 110B are exposed. For example, the etching process removes portions 108A of the ILD 108 over the source features 110A to form source contact trenches 142A, and removes portions 108B over the drain features 110B to form drain contact trenches 142B. The source contact trenches 142A expose at least a portion of the source features 110A; and the drain contact trenches 142B expose at least a portion of the drain features 110B. In some embodiments, the source contact trench 142A and the drain contact trench 142B are formed in one single etching process. In some other embodiments, the source contact trenches 142A and the drain contact trenches 142B are formed in sequential etching processes. The source contact trenches 142A may be formed before or after the drain contact trenches 142B.

In some embodiments, sidewall surfaces of the source contact trenches 142A are at least partially defined by the sidewall surfaces 162A of the spacer layer 134. And sidewall surfaces of the drain contact trenches 142B are at least partially defined by the sidewall surfaces 162B of the spacer layer 134. Accordingly, the source contact trenches 142A each has the width 160A along the X-direction, consistent with the width of the portions 108A before the etching process. And drain contact trenches 142B each has the width 160B along the X-direction, consistent with the width of the portions 108B before the etching process. As described above, in some embodiments, the sidewall surface 162A extends from the perimeter of the top surface 168A of the source features 110A; and the sidewall surface 162B extends from the perimeter of the top surface 168B of the drain features 110B. Accordingly, source contact trenches 142A and drain contact trenches 142B each expose a majority (or the entirety) of the width dimension, along the X-direction, of the source feature 110A and drain feature 110B, respectively. In other words, the widths 160A and 160B of the source contact trench 142A and drain contact trench 142B approximately match the widths of the top surfaces 168A and 168B of the source features 110A and drain features 110B along the X-direction, respectively.

Moreover, the source contact trenches 142A and the drain contact trenches 142B have sidewall surfaces 166A and 166B, respectively, defined by remaining portions of the ILD layer 108. In some embodiments, the source contact trenches 142A each has a width 164A along the Y-direction; and the drain contact trenches 142B each has a width 164B along the Y-direction. In some embodiments, the sidewall surfaces 166B extend from close to the perimeters of the top surfaces (e.g. the outer edges across the Y-direction) of the drain features 110B. Accordingly, the drain trenches 142B expose a majority (or the entirety) of the width of the top surface (across the Y-direction) of the drain feature 110B. In contrast, a sidewall surface 166A extends from outside the perimeter of the top surfaces (e.g. the outer edges across the Y-direction) of the source features 110A. Accordingly, the source trenches 142A have a bottom surface that extend beyond the top surface of the source features 110A in the Y-direction. In other words, the source trenches 142A exposes a surface of the ILD 108 that extends along a top surface of the source features 110A.

In some embodiments, the sidewall surfaces 166A and/or sidewall surfaces 166B spans an angle from the Z-direction that is greater than 0°. Accordingly, the width along the Y-direction of the source contact trenches 142A and/or the drain contact trenches 142B at the top surface of the trenches is different from the width at the bottom surface of the trenches. In such embodiments, the widths 164A and 164B each represent the width of the respective source contact trench 142A and drain contact trench 142B at the mid-height of the trench (referred to as "half-height width"). In other words, the widths 164A and 164B may be average widths along the Y-direction across the heights of the trenches. In some embodiments, the width 164A and the width 164B are substantially the same. In some other embodiments, the width 164A and the width 164B may be different.

Figure 5A:
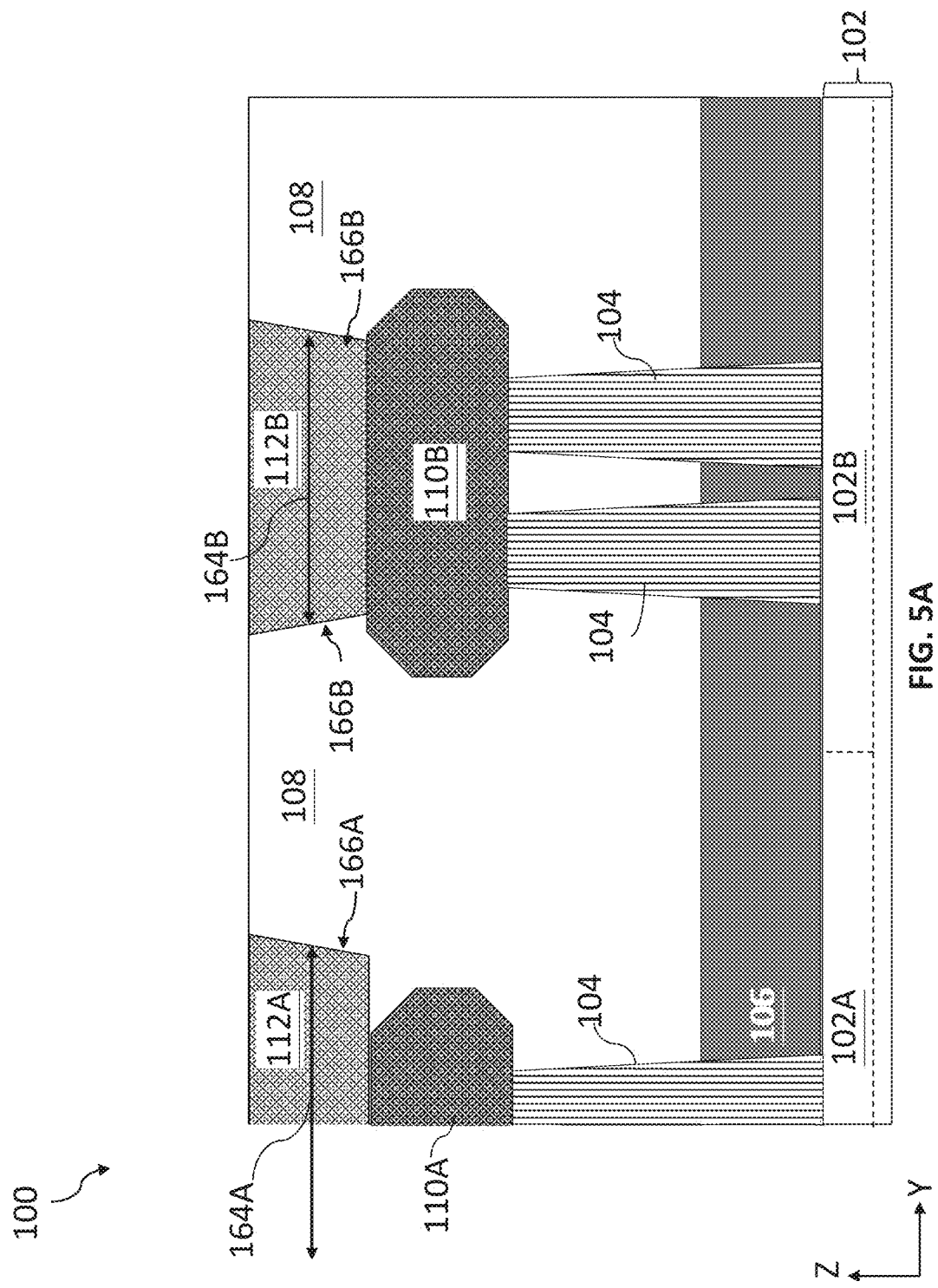

Referring to FIGS. 5A and 5B and block 204 of FIG. 13, a deposition process is used to form contact features that interface with the source features 110A and/or the drain features 110B. For example, source contacts 112A are formed in the source contact trenches 142A such that the source contacts 112A interfaces with the source features 110A; drain contacts 112B and 112B' are formed in the drain contact trenches 142B such that the drain contacts 112B and 112B' each interface with the drain features 110B. Drain contacts 112B and 112B' are adjacent to each other and have similar characteristics. As described in more details later, via features for drain contacts 112B and via features for drain contacts 112B' may be formed in separate steps in order to achieve improved resolutions.

Moreover, the source contacts 112A and the drain contacts 112B and 112B' directly interface with the ILD layer 108 across the Y-direction, and directly interface with the gate spacers 134 across the X-direction through the sidewall surfaces 162A and 162B, respectively. Accordingly, the source contacts 112A have a width 160A across the X-direction and a width 164A across the Y-direction; the drain contacts 112B and 112B' have a width 160B across the X-direction and a width 164B across the Y-direction. These features and dimensions are also illustrated in FIGS. 1B and 1C. In some embodiments, the source contacts 112A and the drain contacts 112B and 112B' are formed in one single deposition process. In some other embodiments, the source contacts 112A and the drain contacts 112B and 112B' are formed in sequential deposition processes. The source contacts 112A may be formed before or after the drain contacts 112B and 112B'. A CMP process may be performed to planarize the top surfaces of the IC device 100, for example, to expose the top surface of the hard mask layer 136.

Figure 6A:
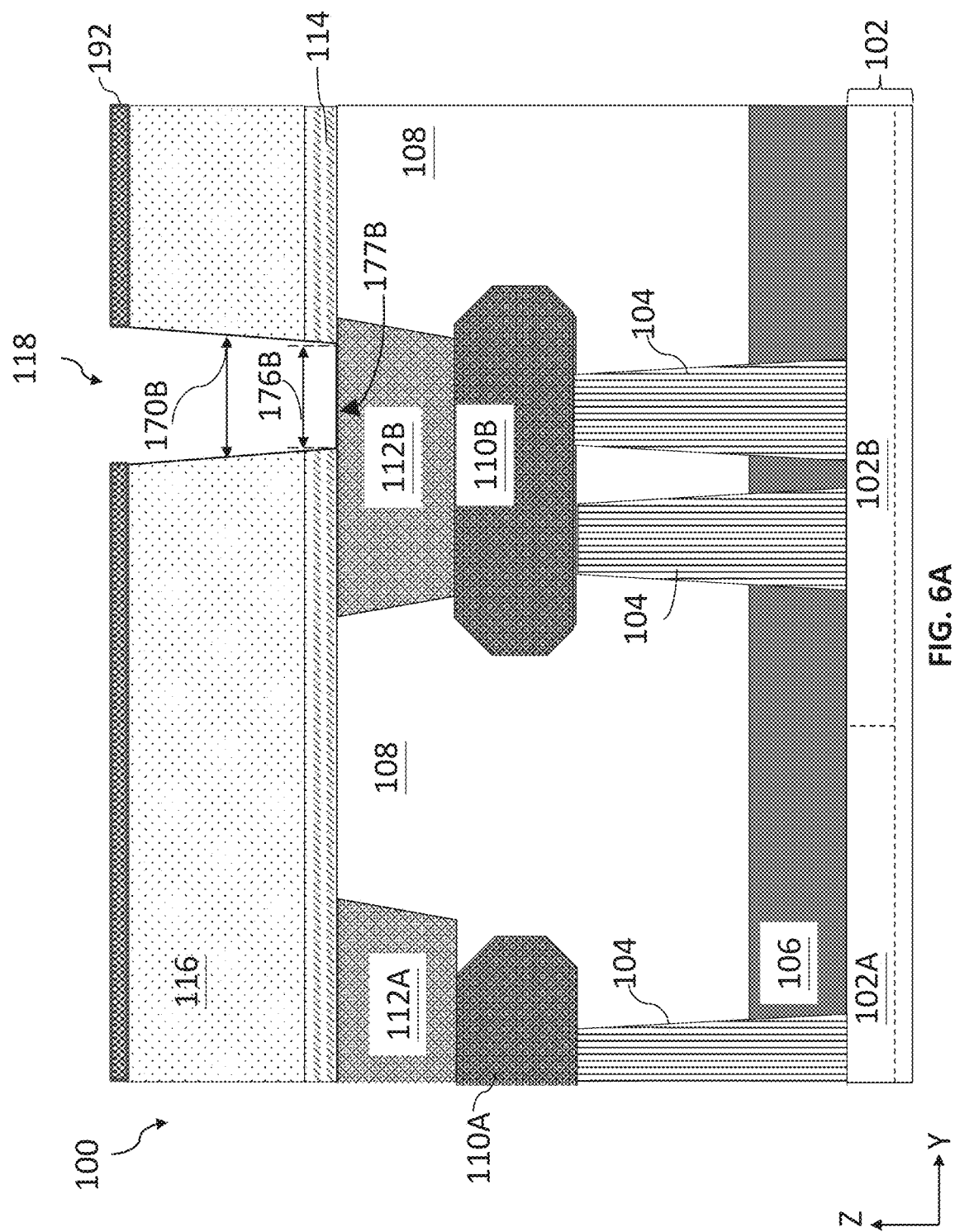
Figure 6B:
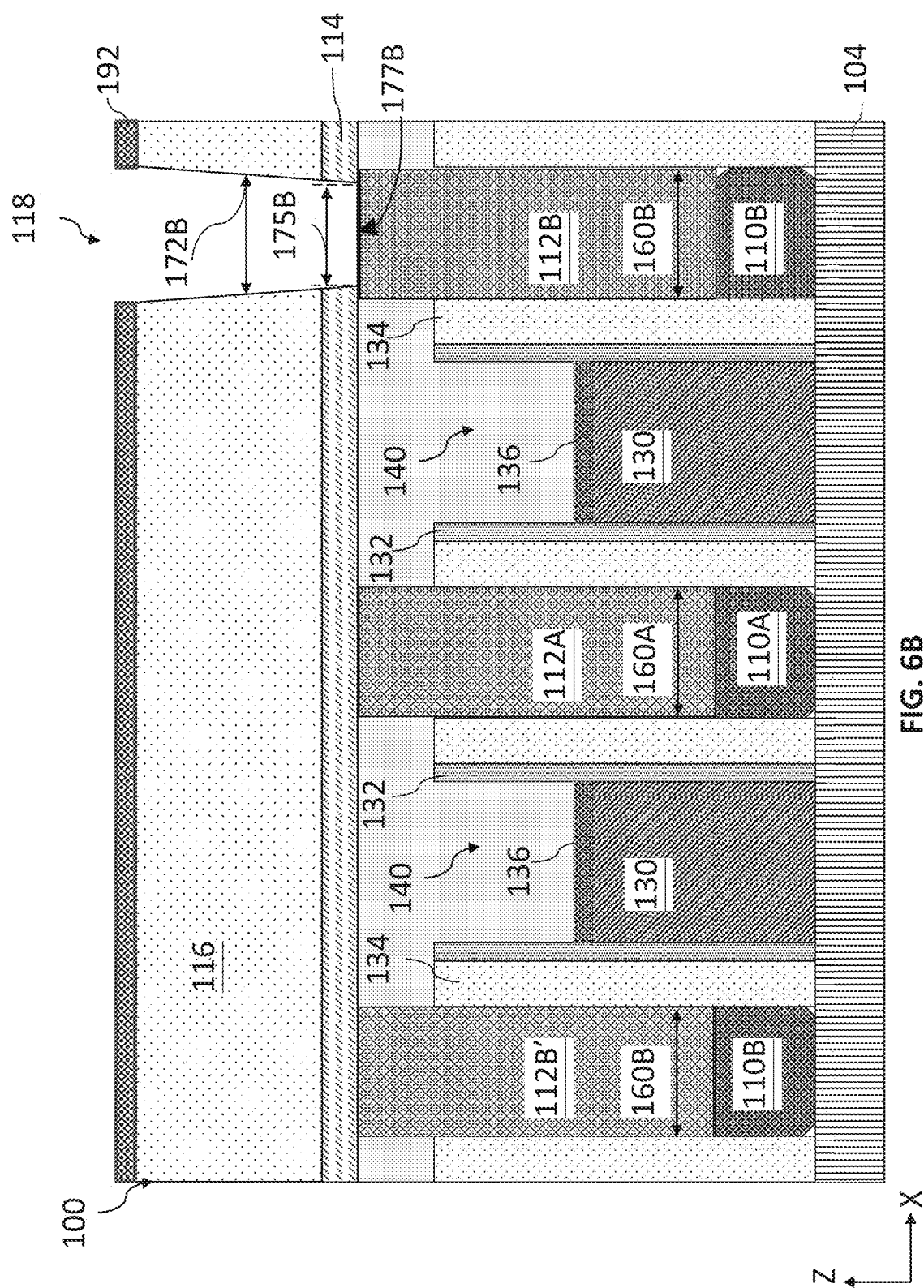

Referring to FIGS. 6A and 6B and block 206 of FIG. 13, an etch stop layer 114 is formed over the IC device 100. For example, the etch stop layer 114 is formed on top surfaces of the source contacts 112A, the drain contacts 112B and 112B', and the hard mask layer 136. The etch stop layer 114 protects the device features not intended to be etched in a subsequent etching process. An ILD layer portion 116 is then formed over the etch stop layer 114. Subsequently, a via trench 118 is formed over the drain regions 102B, such as over the drain contacts 112B. The via trench 118 exposes the top surface of the drain contact 112B for the formation of via structures later. The via trench 118 may be formed by any suitable methods. In some embodiments, a patterned photoresist layer 192 is formed to cover at least the source region 102A while exposing at least a portion of the drain region over a drain contact 112B. The patterned photoresist layer 192 may be formed by lithography process that includes photoresist coating, exposure to ultraviolet (UV) radiation, and developing process. A hard mask, such as silicon nitride, or other suitable material, may be further used. In this scenario, the openings of the patterned photoresist layer 192 is first transferred to the hard mask by etch. Then, an etching process, such as dry etching, wet etching or a combination thereof, is conducted to remove the exposed portions of the ILD layer 116 and etch-stop layer 114 over the drain contact 112B to form the trench 118. The etching process may include one or more etching step.

In the depicted embodiments, the patterned photoresist layer 192 (and any hard masks, if present) covers not only the source contacts 112A but also the drain contacts 112B' that is adjacent to the source contact 112A. Accordingly, the via trenches 118 are formed only on one of the adjacent drain contacts at a time. As described later, another via trench 118' will be formed on the drain contacts 112B' at a later processing stage. In some embodiments, such a separate formation of adjacent via trenches is beneficial to achieve increased resolutions. However, in some other embodiments, the via trenches 118 may be formed on adjacent drain contacts 112B and 112B' at the same time.

In some embodiments, the via trench 118 has a size designed to minimize the resistance between the drains contact 112B and the via structure 120B subsequently formed in the via trench 118, as well as to minimize the resistance between the via structure 120B and the metal line 150B subsequently formed to connect to the via structure 120B. The resistances are partially determined by surface areas of the interfaces between the two contacting features. Accordingly, the sizes of the via trenches 118 may be determined at least partially based on the dimensions of the drain contact 112B and the dimensions of the metal lines 150B. Generally, increased interface surface areas lead to reduced contact resistances. Therefore, the dimensions of the via trench 118 may be designed to maximize the interfaces of the drain contact 112B and the via structure 120B, and between the via structure 120B and the metal line 150B. In some embodiments, the metal lines 150B extend along the X-direction, and the drain contacts 112B extend along the Y-direction. Accordingly, to simultaneously maximizing the two relevant interfaces, the via structure 120B may be designed to have a profile and sizes that approximately matches the overlapped region (such as region 190B on FIG. 1C) between the projection of the metal lines 150B on the X-Y plane and the projection of the drain contacts 112B on the X-Y plane.

In some embodiments, the via trench 118 may have a width 170B along the Y direction and a width 172B along the X direction. In some embodiments, the via trench 118 has varying widths along the Z-direction. For example, the via trench 118 may have a larger opening at its top surface than at its bottom surface. In such scenarios, the width 170B and the width 172B each refers to the respective half-height widths (described above). In some embodiments, the profiles of the sidewalls of the via trenches 118 are substantially straight. Accordingly, the half-height width is about the same as the averaged width of the via trenches 118 along their height. In some embodiment, the width 170B is smaller than the width 164B of the drain contact 112B along the Y-direction. Moreover, in some embodiments, the entirety of bottom opening of the trenches 118 along the Y-direction (that defines the width 170B) is formed on the top surface of the drain contact 112B. In other words, no portion of the bottom opening of the via trench 118 extends beyond the drain contact 112B along the Y-direction. In some embodiments, the trench 118 exposes a portion 177B of the top surface of the drain contact 112B. As described later, the portion 177B defines the area on which interface between the drain via and the drain contact 112B. Accordingly, the portion 177B is hereinafter referred to as the interface 177B. In some embodiments, the interface 177B has a dimension 175B along the X-direction and a dimension 176B along the Y-direction. The dimension 175B is similar to (e.g. the same as) the width 172B; and the dimension 176B is similar to (e.g. the same as) the width 170B. Furthermore, the interface 177B falls within the overlapped region 190B (see FIG. 1C) between the projection of the metal lines 150B on the X-Y plane and the projection of the drain contacts 112B on the X-Y plane.

In some embodiments, the width 172B of the via trenches 118 along the X-direction is similar to (or the same as) the width 160B. For example, a ratio of the width 172B to the width 160B may be about 0.8:1 to about 1.2:1. It is understood that for the purpose of reducing contact resistance, it is the area of the interface between the two features that matters. Accordingly, if the ratio is too small, such as less than 0.8:1, or if the ratio is too large, such as greater than 1.2:1, the available surface areas are not effectively utilized to form the interface, and the contact resistance is not minimized. In some embodiments, the width 172B is similar to the width 170B. For example, a ratio of the width 172B to the width 170B is about 0.5:1 to about 5:1. In some embodiments, a ratio of the width 172B is approximately the same as the width 170B. Accordingly, the via trench 118 has a square profile on the X-Y cross section. Moreover, in some embodiments, the entirety of bottom opening of the trenches 118 along the X-direction (that defines the width 172B) is formed on the top surface of the drain contact 112B. In other words, no portion of the bottom opening of the via trench 118 extends beyond the drain contact 112B along the X-direction. In some embodiments, the entirety of the bottom opening of the via trench 118 is formed on, and thereby exposes, a portion of the top surface of the drain contact 112B. In other words, no portion of the bottom opening of the via trench 118 extends beyond the top surface of drain contact 112B in any direction. In some embodiments, the via trench 118 substantially aligns with the drain contact 112B along the Z-direction. In other words, the via trench 118 is not offset from the drain contact 112B along the Z-direction. Such configurations allow the contact resistance to be minimized.

Figure 7B:
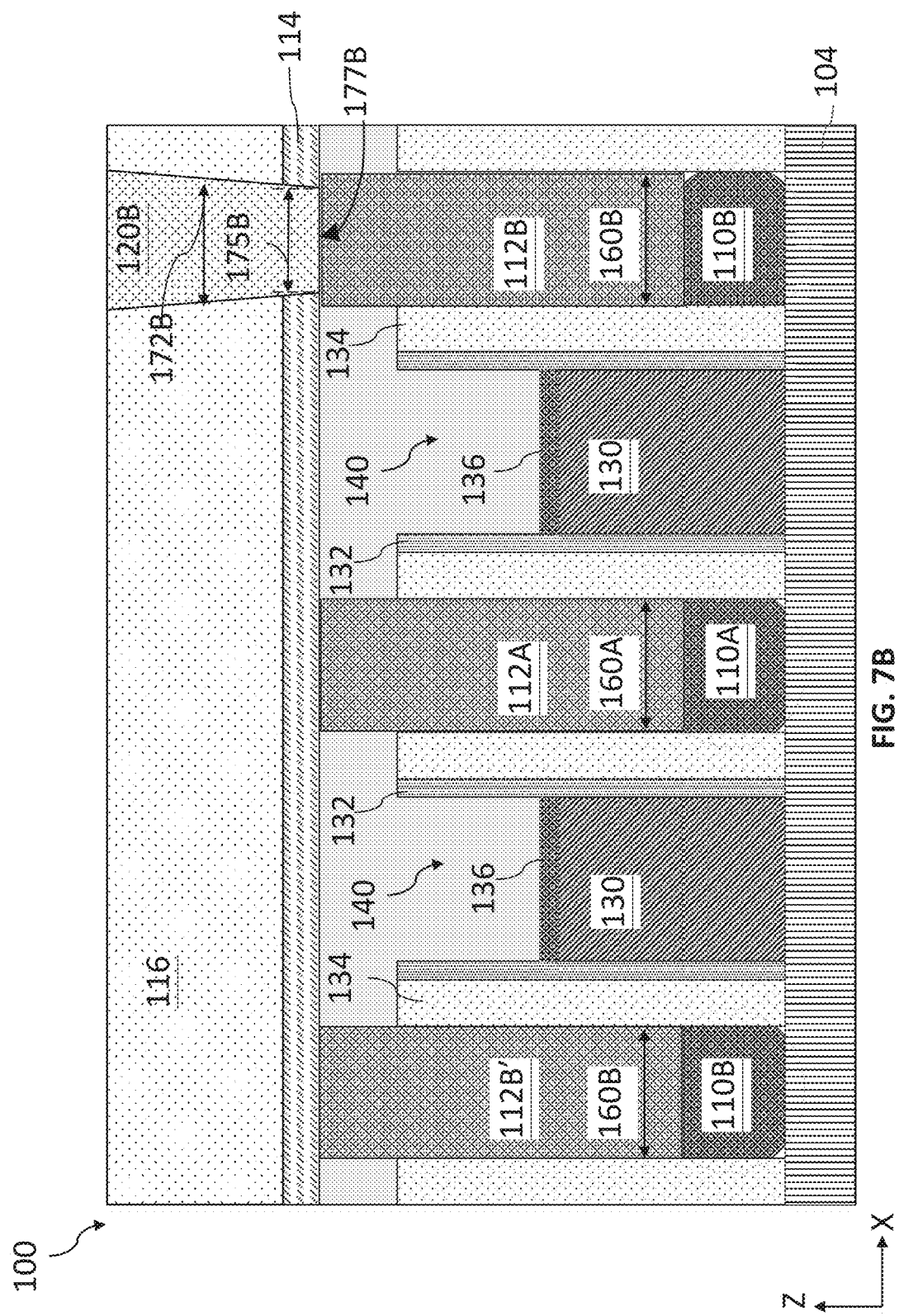

Referring to FIGS. 7A and 7B and block 208 of FIG. 13, a via structure 120B is formed in the via trenches 118B, such that the via structure 120B connects with the drain contacts and form good electric contacts. Accordingly, the via structure 120B is formed on the interface 177B. Any suitable methods may be used to form the via structure 120B. For example, a via metal material is deposited into the via trenches 118 with, for example, a Chemical Vapor Deposition (CVD) method, an Atomic Layer Deposition (ALD) method or the like. A CMP process is then employed to remove excess materials and planarize the top surface. The via metal material may be any suitable metal materials, such as cobalt (Co), ruthenium (Ru), copper (Cu), tantalum (Ta), titanium (Ti), iridium (Ir), tungsten (W), aluminum (Al), tantalum nitride (TaN), titanium nitride (TiN), other suitable metals, or combinations thereof. In some embodiments, the via metal material may be W, Ru, or combinations thereof, and the via structure is formed in direct contact with the ILD layer 116 and/or the etch-stop layer 114 on its sidewall surfaces. In other words, no intervening layers (barrier layer, adhesion layer, etc.) are present between the ILD layer 116 and the via structure 120B. Such a configuration allows the size of the via structures 120B to be maximized, and the resistances to be minimized. Accordingly, the via structure 120B has a size consistent with the via trench 118. For example, the via structure 120B has the width 172B along the X direction and the width 170B along the Y-direction. These features and dimensions are also illustrated in FIGS. 1B and 1C. In some embodiments, the width 170B is about 3 nm to about 60 nm; and in some embodiments, the width 172B is about 3 nm to about 60 nm. In some embodiments, the width 170B is about 9 nm to about 20 nm; and in some embodiments, the width 172B is about 9 nm to about 20 nm. In some embodiments, the via structure 120B has a square profile on the X-Y cross-section.

Figure 8A:
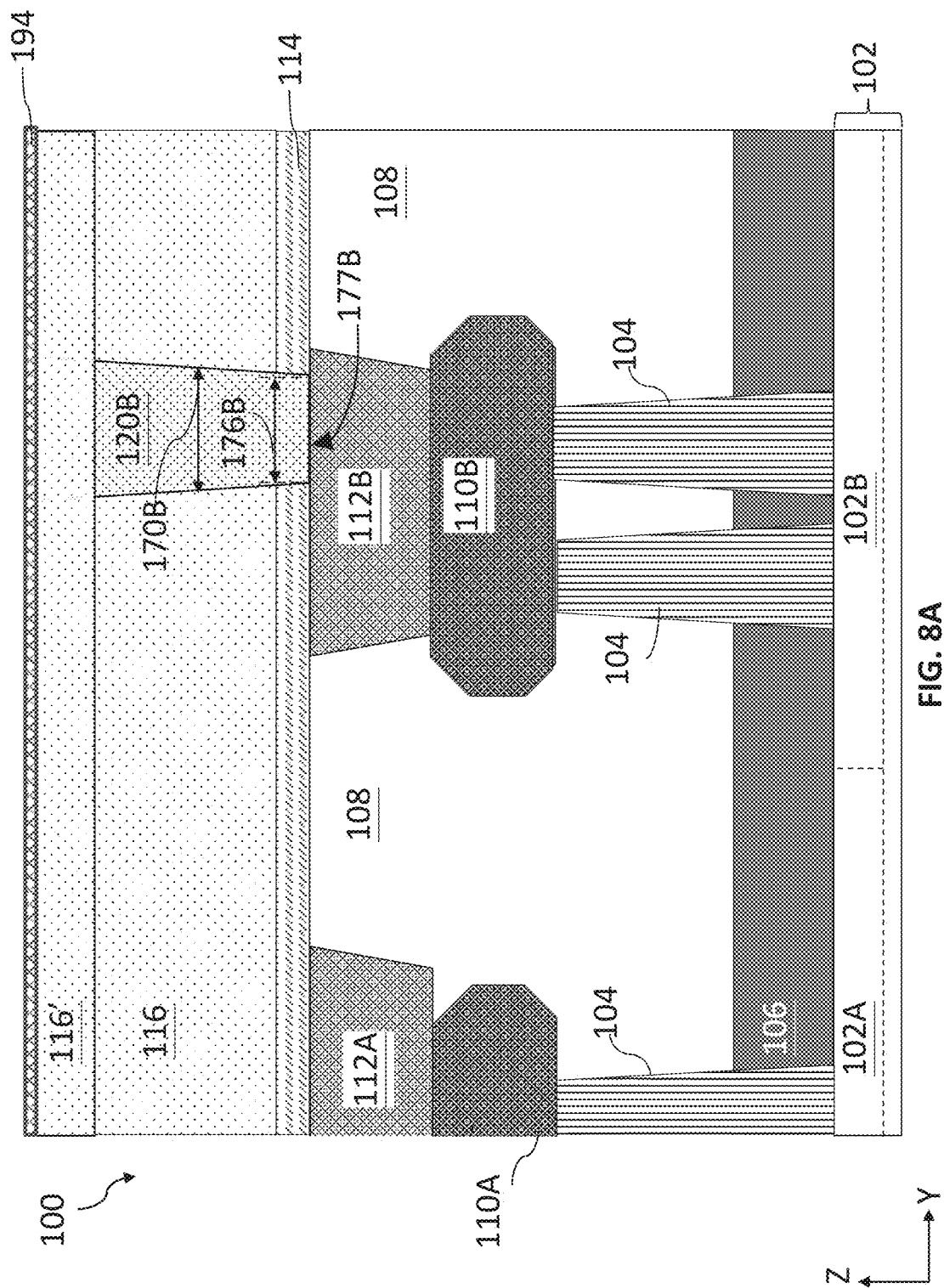
Figure 8B:
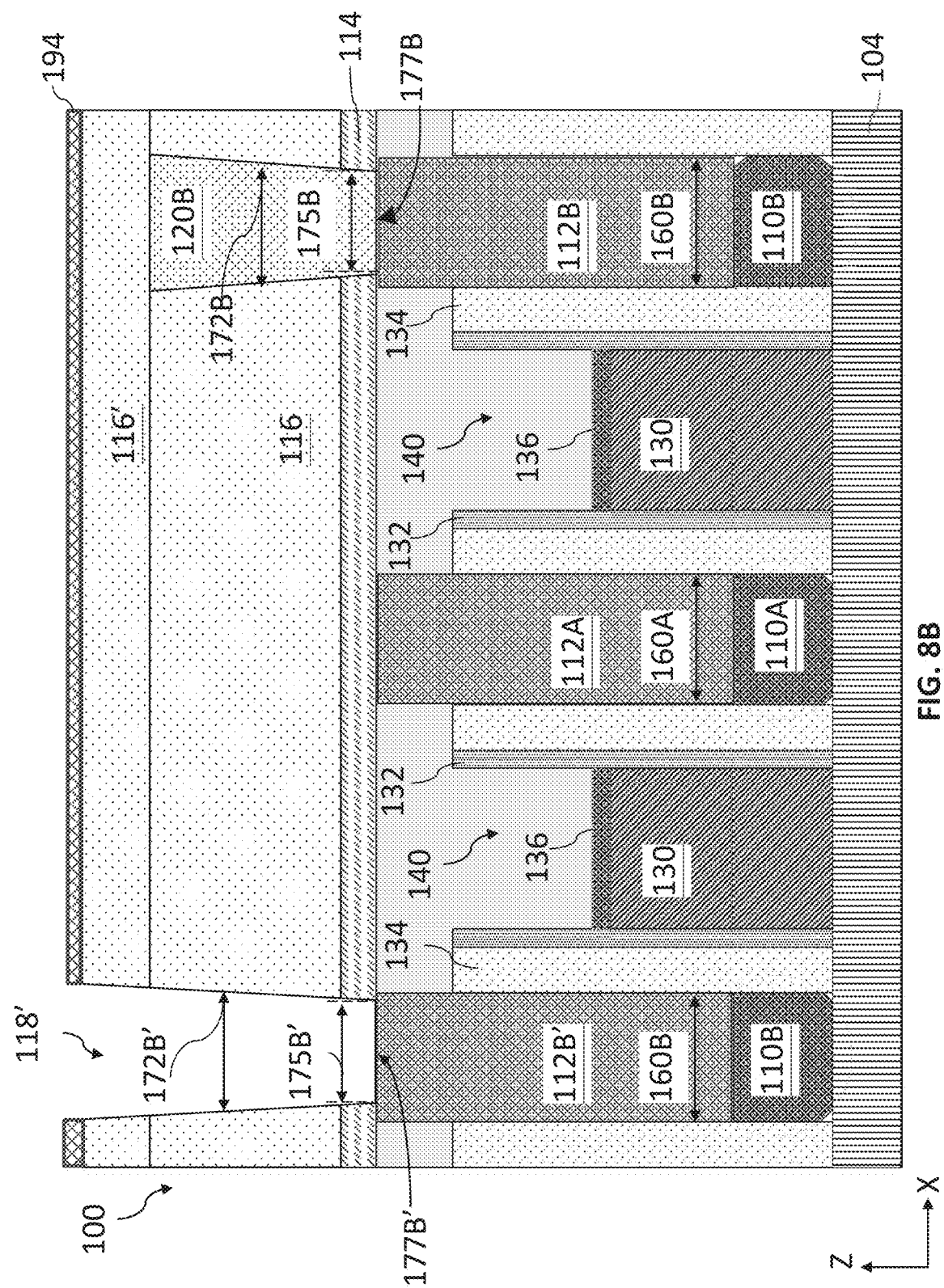

Referring to FIGS. 8A and 8B and block 210 of FIG. 13, an ILD layer portion 116' is formed over the ILD layer portion 116 and over the via structure 120B. In some embodiments, the ILD layer portion 116' helps maintain the integrity of the via structure 120B during subsequent processes. Another via trench 118' is formed that extends through the ILD layer portion 116', the ILD layer portion 116, and the etch-stop layer 114, to expose the top surface of another drain contact 112B. For example, another patterned photoresist layer 194 may be formed over the source region 102A, and at least a portion of the drain regions 102B (such as the portion including the drain contact 112B), while exposing another portion of the drain regions 102B (such as the portion including the drain contact 112B'). Similarly, a hard mask may also be used. In some embodiments, the via trench 118' has a width 172B' across the X-direction. The via trench 118' generally resembles the via trench 118 described. For example, the via trenches 118' may have dimensions that are similar to via trenches 118. Therefore, the width 170B' (not labeled) may be similar to the width 170B of the via trenches 118. However, this disclosure also contemplates the via trenches 118' having different dimensions (such as across the X-direction and/or across the Y-direction). The via trenches 118' exposes a portion 177B' of the top surface of the drain contact 112B'. Similar to the portion 177B described above, the portion 177B' defines the area on which the interface between the drain via 120B' and the drain contact 112B' is formed. Accordingly, the portion 177B' is interchangeably referred to as the interface 177B'. The interface 177B' is formed within the overlapped region 190B' (see FIG. 1C) between the metal lines 150B and the drain contacts 112B'. In some embodiments, the interface 177B' has a dimension 175B' along the X-direction and a dimension 176B' (not labeled) along the Y-direction. The dimension 175B' is similar to (e.g. the same as) the width 172B'; and the dimension 176B' is similar to (e.g. the same as) the width 170B'.

Figure 9B:
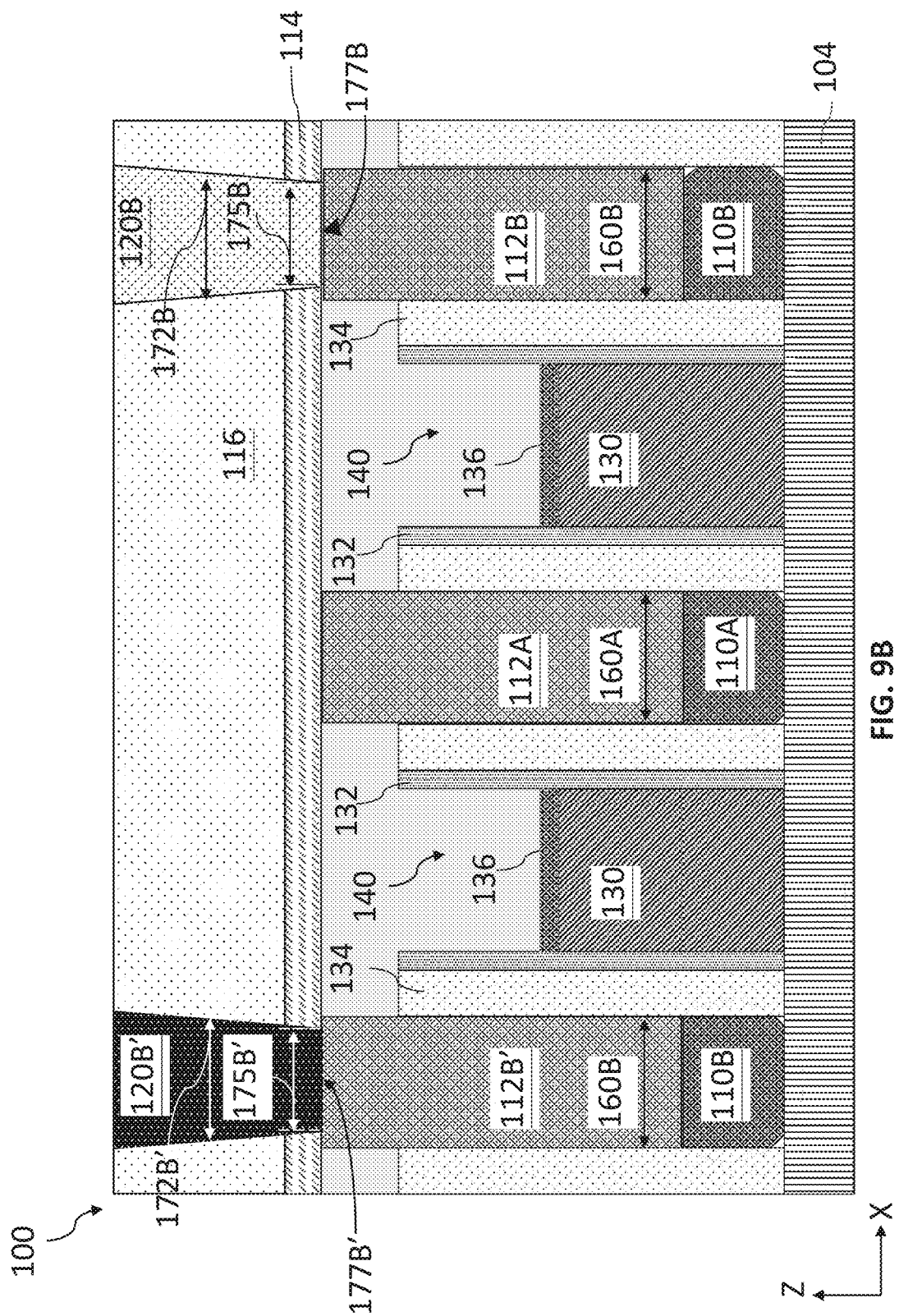

Referring to FIGS. 9A and 9B and block 212 of FIG. 13, via structures 120B' are formed in the via trench 118' to connect with the drain contacts 112B' and form good electric contacts. For example, the via structures 120B' directly interfaces with the drain contact 112B' at the interface 177B'. In some embodiment, a CMP process is employed to expose the top surfaces of the via structure 120B'. For example, a CMP process is conducted until a top surface of the via structure 120B' is coplanar with a top surface of the via structure 120B. As described here, the via structures 120B' (and via trenches 118') and the via structures 120B (and the via trenches 118) are formed on adjacent drain contact features. For example, a series of drain contact features 112B have been formed in a row along the X-direction. Via structures 120 are formed over the first, the third, the fifth, and the seventh drain contact features 112B; and via structures 120' are formed over the second, the fourth, the sixth, the eighth drain contact features 112B. As described above, forming via structures 120B and 120B' sequentially allows better processing margins and resolutions. Via structures 120B' generally resembles via structures 120B. For example, the via structure 120B' may have a square profile on the X-Y cross-section, similar to the via structure 120B. In some embodiments, via structures 120B' may have a material composition the same as or different from the via structures 120B, depending on design requirements.

Figure 10A:
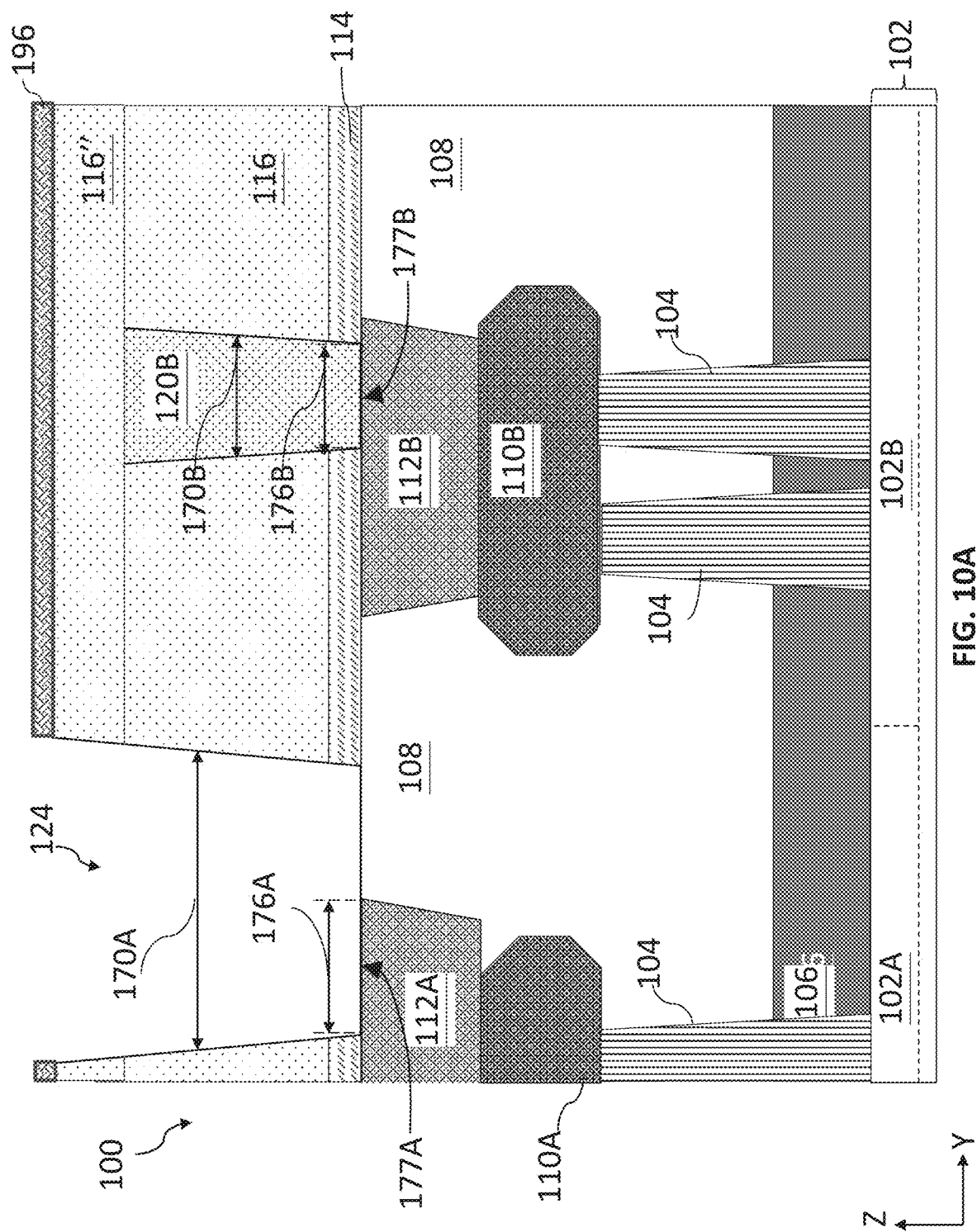
Figure 10B:
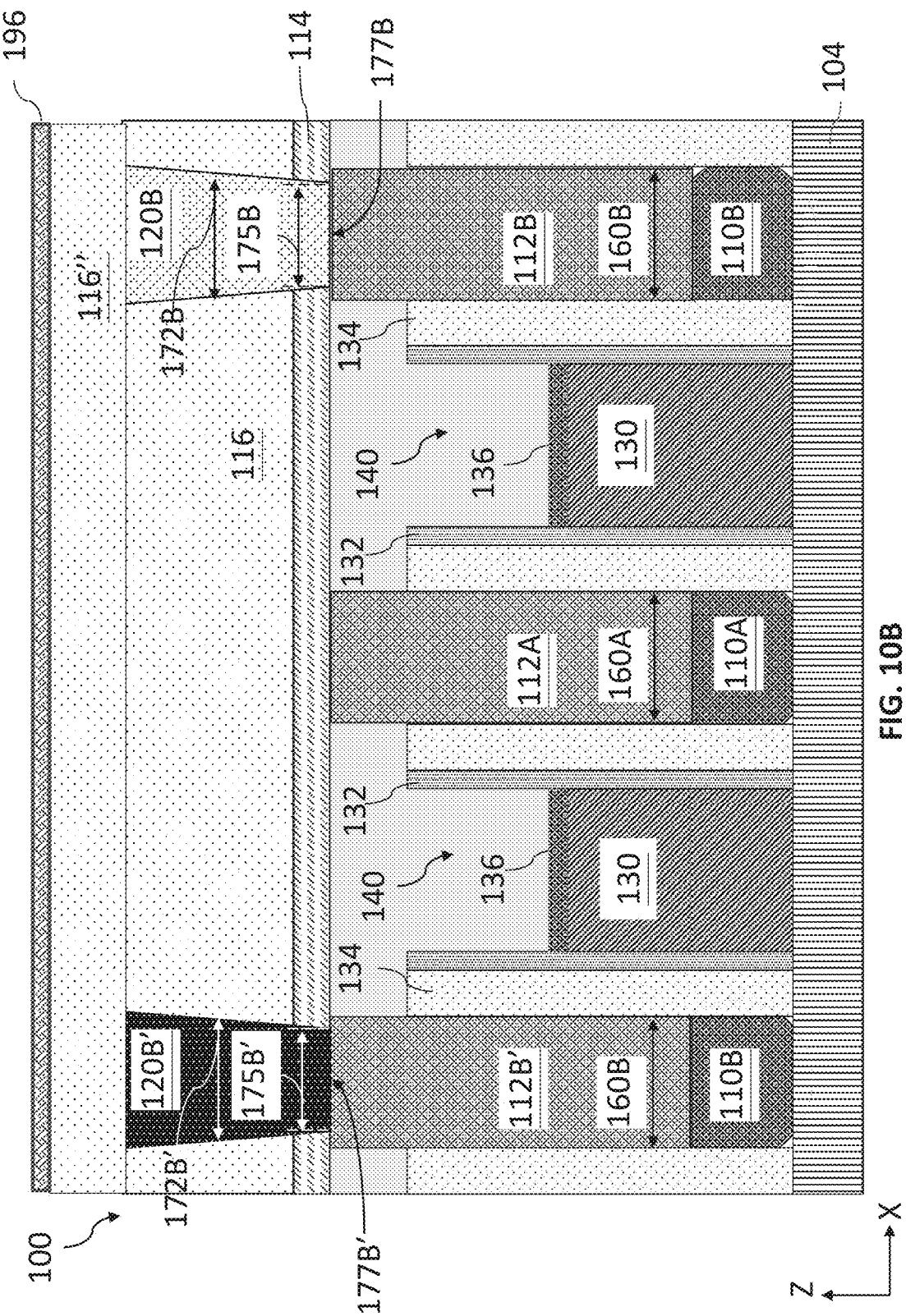

Referring to FIGS. 10A and 10B and block 214 of FIG. 13, an ILD layer portion 116" is formed over the ILD layer 116. In some embodiments, the ILD layer portion 116" protects the via structures already formed. A patterned photoresist layer 196 (and/or a hard mask layer) may be formed over the ILD layer portion 116" to cover the drain region 102B, while exposing at least a portion of the source regions 102A (such as the portion including the source contact 112A). Subsequently, the ILD layer (including, for example, portion 116 and 116") and the etch-stop layer 114 are etched to form a via trench 124, using the patterned photoresist layer 196 (or the hard mask layer).

Similar to via trenches 118 and/or 118', the via trench 124 may have a size designed to minimize the resistance between the source contact 112A and the via structure 120A subsequently formed in the via trench 124, as well as to minimize the resistance between the via structure 120A and the metal line 150A subsequently formed to connect to the via structure 120A. Accordingly, the sizes of the via trenches 124 may be determined at least partially based on the dimensions of the source contact 112A and the dimensions of the metal lines 150A. For example, the dimensions of the via trench 124 may be designed to maximize the interfaces of the source contact 112A and the via structure 120A, and between the via structure 120A and the metal line 150A. In some embodiments, the metal lines 150A extend along the X-direction, and the source contacts 112A extend along the Y-direction. Accordingly, to simultaneously maximizing the two relevant interfaces, the via structure 120A may be designed to have a profile and sizes that approximately matches the overlapped region (such as region 190A on FIG. 1B) between the metal lines 150A and the drain contacts 112A.

The via trench 124 has a width 170A (or half-height width) along the Y-direction and a width 172A (or half-height width) along the X-direction. In some embodiments, the via trench 124 has a size that is greater than the via trench 118 and/or via trench 118'. For example, the width 170A may be about 3 nm to about 300 nm. In some embodiment, the width 170A may be about 12 nm to about 60 nm. In some embodiments, a ratio of the half-height width 170A to the half-height width 170B of the via trench 118 and/or 118' is about 1.1:1 to about 12:1. The larger width of the via trenches leads to larger contact surface (or interface) between the via structure subsequently formed in the via trench 124. If the ratio is too small, such as less than 1.1:1, the via structure 120A may not have reached its maximal size without compromising other device properties. Accordingly, the contact resistance between the via structure and the source contact 112A and/or metal line 150A subsequently formed is not optimized. If the ratio is too large, such as greater than 12:1, the via structure 120A may extend beyond the available contact surface area of the metal line 150A. Accordingly, not all of the via size is utilized for contact resistance reduction; rather, the increased via size may increase the chip footprint, impeding with the overall goal of down-scaling. In some embodiments, a ratio of the half-height width 170A to the half-height width 170B of the via trench 118 and/or 118' is about 1.5:1 to about 6:1, so as to provide optimally balanced device performance and feature sizes. In some embodiments, the width 172A is similar to (such as about the same as) the width 172B.

As described above, the etching process exposes a portion of the top surface of the source contact 112A. For example, the portion 177A is exposed. The portion 177A defines the area on which the interface between the via structure and the source contacts 112A is formed, and is hereinafter interchangeably referred to as the interface 177A. The interface 177A is formed on the overlapped region 190A (see FIG. 1B). In some embodiments, the interface 177A has a dimension 175A along the X-direction and a dimension 176A along the Y-direction. The dimension 175A (not labeled) may be similar to (e.g. the same as) the width 175B and/or 175B'; and the dimension 176A may be greater than the width 176B and/or 176B'. Accordingly, the interface 177A of the top surface of the source contact 112A has a greater surface area than the interface 177B of the top surface of the drain contact 112B. In some embodiments, the via trench 124 does not substantially align with the source contact 112A along the Z-direction and on the Y-Z cross-section. In other words, the via trench 124 is offset from the source contact 112A along the Z-direction on the Y-Z cross-section. This may be beneficial to achieve the desired packing density of features. In some embodiments, portions of bottom opening of the trenches 124 extends beyond the interface 177A along the Y-direction. Accordingly, a portion of the top surface of the ILD layer 108 (that extends along the top surface with the source feature 112A) is exposed in the via trenches 124.

In some embodiments, the via trench 124 may extend from close to the perimeter (or edges along the X-direction) of the top surfaces of the source contact 112A. Accordingly, the width 172A is similar to (for example, about the same as) the width 160A of the source contact 112A. For example, a ratio of the width 172A to the width 160A may be about 0.8:1 to about 1.2:1. If the ratio is too small, such as less than 0.8:1, or if the ratio is too large, such as greater than 1.2:1, the available surface areas are not effectively utilized for contact resistance reduction. In some embodiments, the entirety of bottom opening of the trenches 124 along the X-direction (that defines the width 172A) is formed on the top surface of the source contact 112A. In other words, no portion of the bottom opening of the via trench 124 extends beyond the source contact 112A along the X-direction. In some embodiments, the entirety of the bottom opening of the via trench 124 is formed on, and thereby exposes, a portion of the top surface of the source contact 112A along the X-direction. In some embodiments, the via trench 124 substantially aligns with the source contact 112A along the Z-direction and on the X-Z cross-section. In other words, the via trench 124 is not offset from the source contact 112A along the Z-direction on the X-Z cross-section. In some embodiments, the width 170A is greater to the width 172A. For example, a ratio of the width 170A to the width 172A is about 1:1 to about 33:1. In other words, the via trench has a rectangular profile on the X-Y cross section, with its length (or the longer dimension) extending along the Y-direction and its width (or the shorter dimension) extending along the X-direction. As described in more detail below, the greater width 170A may be utilized to form a larger interface, along the Y-direction, between via structures and metal lines subsequently formed, so as to reduce contact resistances with the metal lines.

Figure 11A:
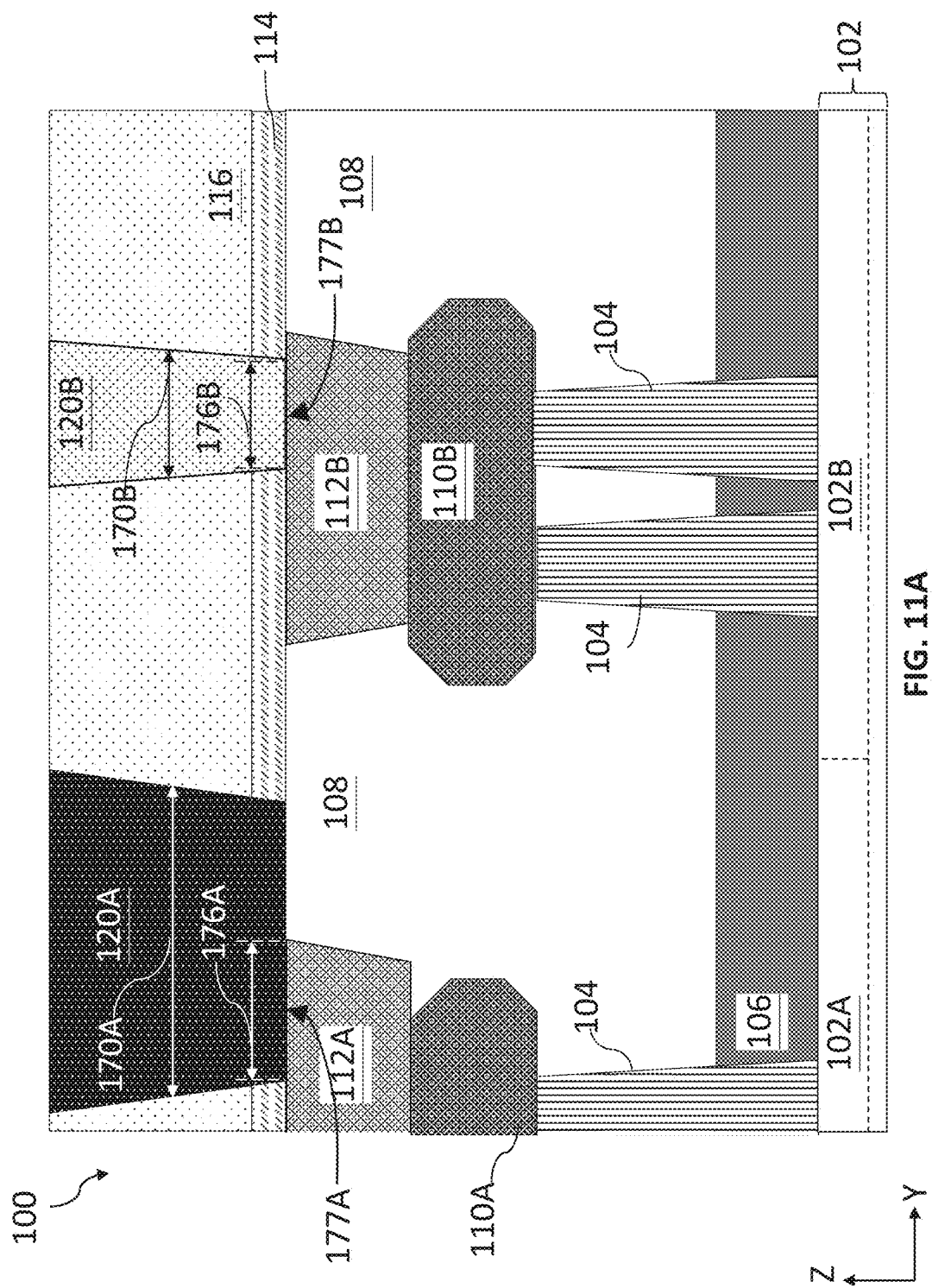
Figure 11B:
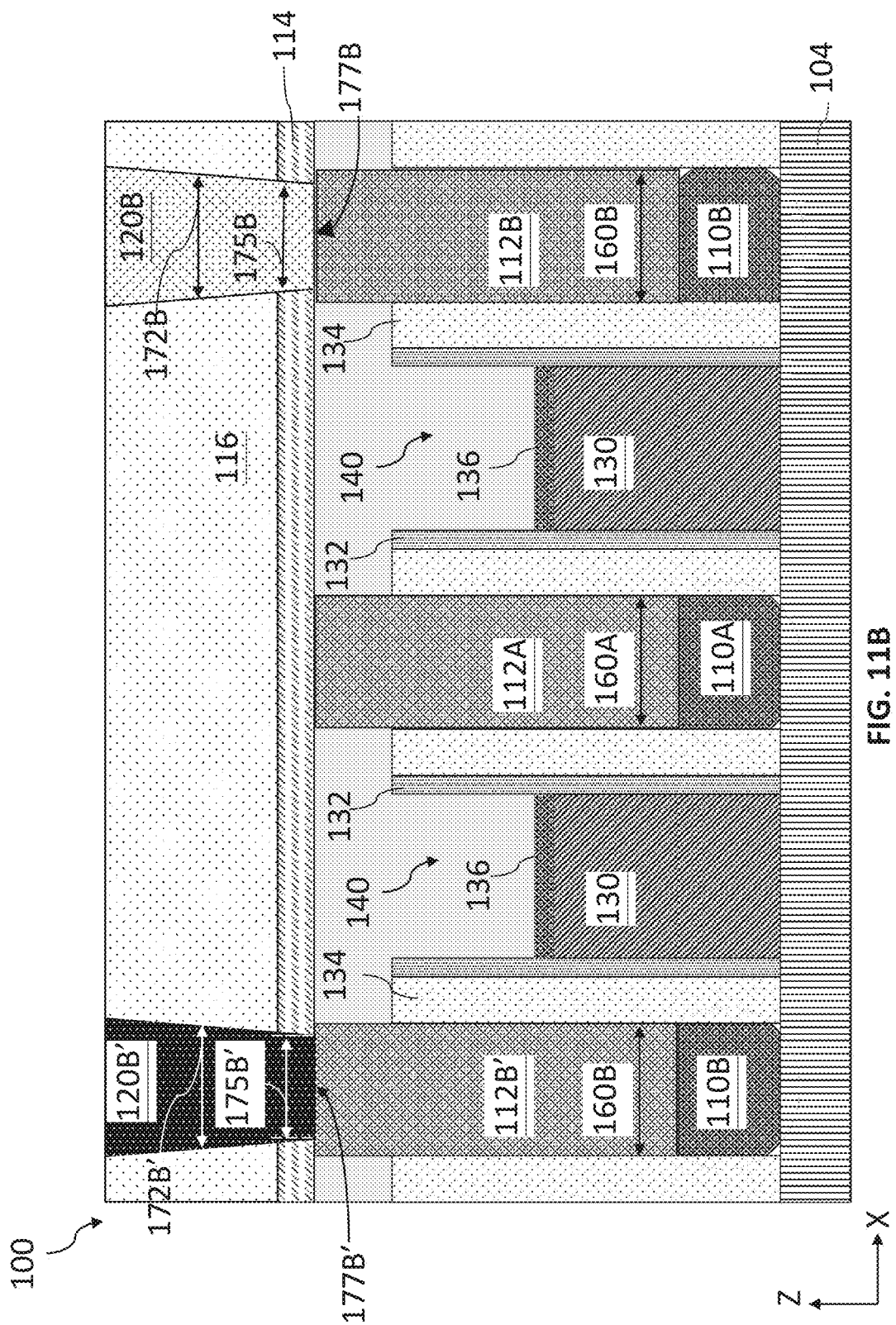

Referring to FIGS. 11A and 11B and block 216 of FIG. 13, via structures 120A are formed in the via trenches 124, such that the via structure 120A connects with the source contacts and form good electric contacts. In some embodiments, the via structures 120A are formed in direct contact with the ILD layer 116 and/or the etch-stop layer 114 on its sidewall surfaces. In other words, no intervening layers (barrier layer, adhesion layer, etc.) are present between the ILD layer 116 and the via structure 120A. This allows the size of the via structures 120A to be maximized for the purpose of resistance reduction. Accordingly, the via structure 120A has a size consistent with the via trench 124. For example, the via structure 120A has the width 172A along the X direction and the width 170A along the Y-direction. In some embodiments, the width 170A is about 3 nm to about 300 nm; and in some embodiments, the width 172A is about 3 nm to about 20 nm. In some embodiments, the width 170A is about 9 nm to 60 nm, and the width 172A is about 9 nm to about 20 nm. Moreover, the via structure 120A has a rectangular profile on the X-Y cross-section with its length (or the longer dimension) extending along the Y-direction and its width (or the shorter dimension) extending along the X-direction.

The via structures 120A may be formed on the interface 177A. As described above, the interface 177A has a dimension 175A along the X-direction and a dimension 176A along the Y-direction. The interface 177A has a greater surface area than the interface 177B (and interface 177B'). The greater surface area allows the contact resistance between the source via structure 120A and the source contact 112A to be minimized. In some embodiments, consistent with the via trenches 124, the via structure 120A extends beyond the top surface of the source contact feature 112A on the Y-Z cross-section, but substantially aligns with the source contact feature 112A on the X-Z cross-section. These features and dimensions are also illustrated in FIGS. 1B and 1C.

While the above description describes forming the via structures 120B and via structures 120B' first followed by the forming of the via structures 120A. However, the via structures 120B, the via structures 120A, and the via structures 120B' may be formed in any orders. Moreover, via structures 120A on adjacent source contacts may be formed in more than one steps too, similar to the forming of via structures 120B and 120B' on adjacent drain contacts.

Figure 12A:
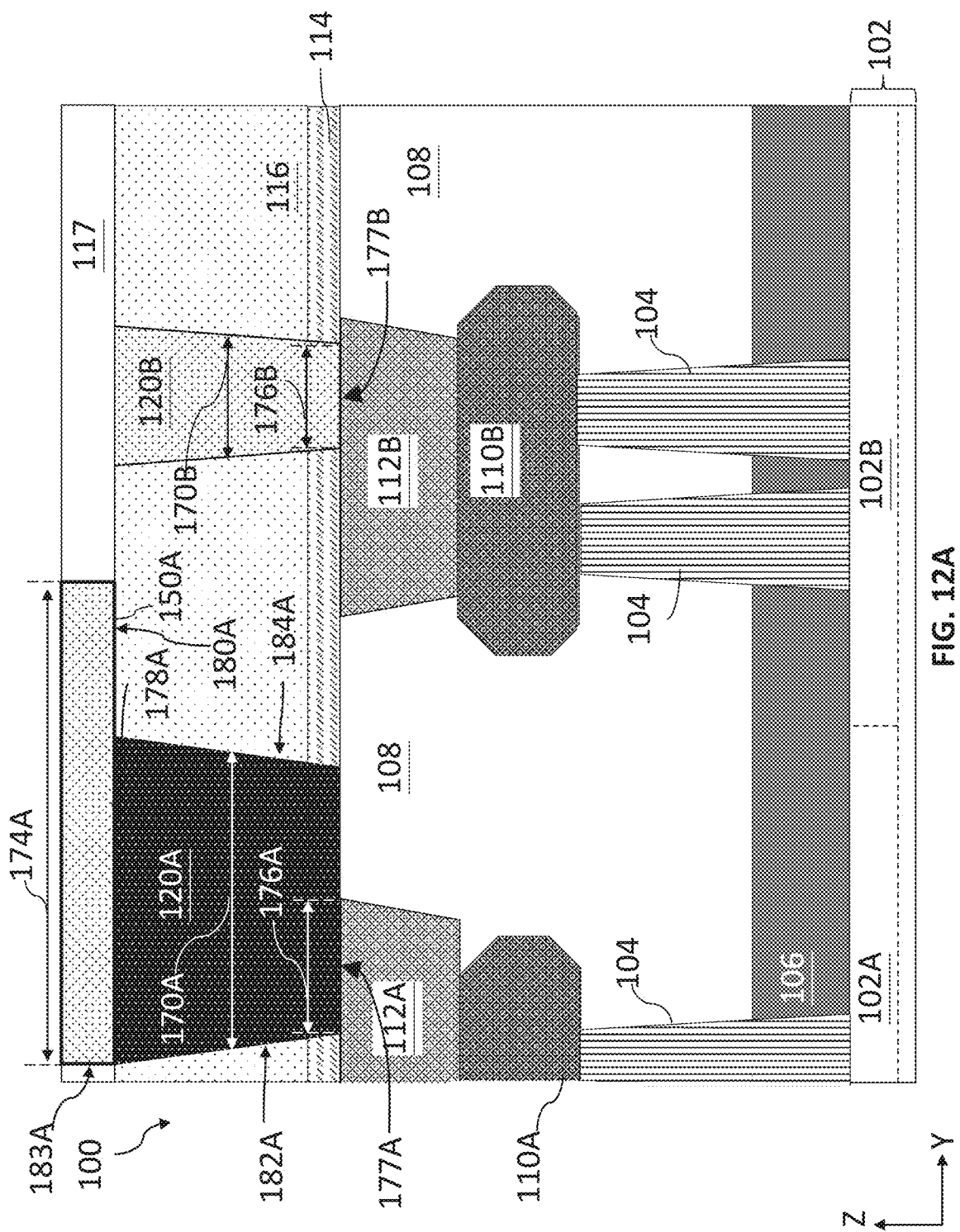
Figure 12B:
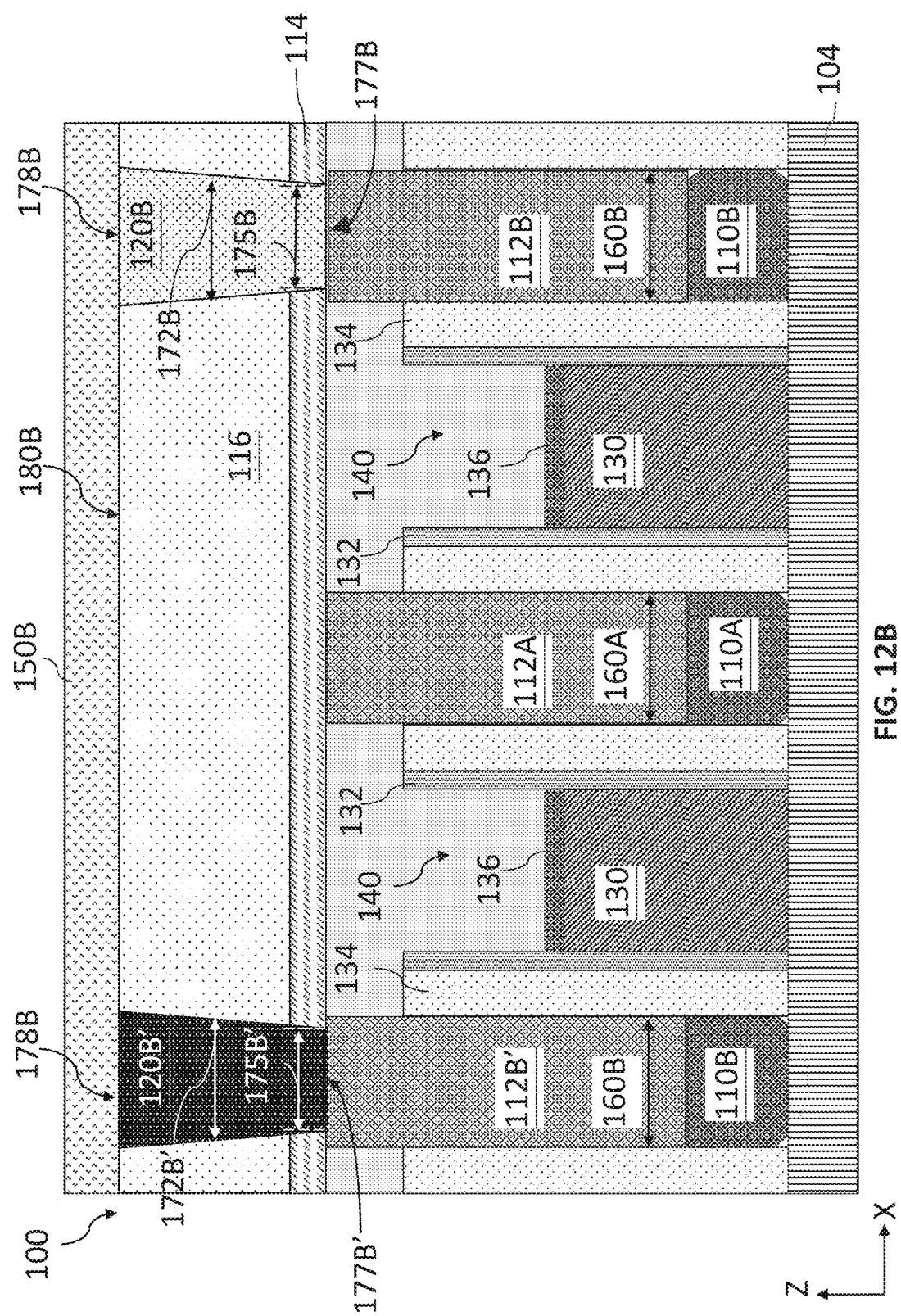

Referring to FIGS. 12A and 12B and blocks 218 and 220 of FIG. 13, metal lines 150A are formed over the via structures 120A such that the source features 110A is connected through the source contact 112A, via structure 120A, the metal line 150A to a voltage and/or other features; and metal lines 150B are formed over the via structures 120B such that the source features 110B is connected through the source contact 112B, via structure 120B, the metal line 150B to a voltage and/or other features. The metal lines 150A and 150B may be formed within another ILD layer 117. The metal lines 150A and 150B may be formed simultaneously or sequentially in any order. The metal lines 150A and 150B each extends along the X-direction and across a plurality of gate structures, source regions, and drain regions. The metal lines 150A has a width 174A along the Y-direction and the metal lines 150B has a width 174B along the Y-direction. In some embodiments, the width 174A is greater than the width 174B. In some embodiments, it may be preferable to have metal lines 150A that are wider than metal lines 150B. For example, resistances on the source side may have a larger impact on the device performances than the resistances on the drain features. Moreover, in some embodiments, one source feature may feed into two or more drain features. Such designs may require a higher voltage level and/or a higher current level on the source side as compared to the drain side. Accordingly, wider metal line for the source features may be beneficial. In some embodiments, a ratio of the width 174A to the width 174B is about 0.5:1 to about 30:1. In some embodiments, a ratio of the width 174A to the width 174B is about 1:1 to about 20:1. If the ratio is too small, such as less than 0.5:1, the metal lines 150A may constitute a bottleneck in the flow of charge carriers and degrade the device performances; if the ratio is too large, such as greater than 30:1, the additional benefit provided by the even wider metal lines 150A may not be sufficient to justify the extra chip footprint they require. In some embodiments, the width 174A is about 8 nm to about 300 nm; and the width 174B is about 8 nm to about 200 nm. In some embodiments, metal lines 150C are also formed to connect directly to the gate structures 140. Metal lines 150C may have characteristics that resemble the metal lines 150B.

In some embodiments, the metal lines 150A each span across the entire top surfaces of the via structures 120A. For example, the metal line 150A has a bottom surface 180A. The bottom surface 180A interfaces with the via structure 120A, as well as with the ILD layer portion 116. Moreover, the entirety of the via structure 120A is covered by the bottom surface 180A. In other words, the width 174A of the metal line 150A is greater than the width 170A of the via structure 120A on the Y-Z cross section. Additionally, the metal line 150A spans across the width 172A of the via structure 120A on the X-Z cross-section. Accordingly, the metal line 150A may have an interface 178A with the via structure 120A, and the interface 178A extends within a bottom surface 180A of the metal line 150A. In some embodiments, a sidewall surface 182A of the via structure 120A (e.g. substantially along a X-Z plane) extends from the perimeter of the metal line 150A (e.g. from the perimeter of the bottom surface 180A). In other words, sidewall surface 182A of the via structure matches the sidewall surface 183A of the metal line 150A. Meanwhile, an opposing sidewall surface 184A of the via structure 120A extends from within the perimeter of the metal line 150A (e.g. within the perimeter of the bottom surface 180A). These features and dimensions are also illustrated in FIG. 1B. Having the matching sidewall between the via structure 120A and the metal line 150A ensures that the size of the via structure 120A is maximized without occupying additional chip areas.

Similarly, the metal lines 150B may each span across the entire top surfaces of the via structures 120B. For example, the metal line 150B has a bottom surface 180B. The bottom surface 180B interfaces with the via structure 120B and/or 120B', as well as with the ILD layer portion 116. Moreover, the entirety of the via structure 120B is covered by the bottom surface 180B. In some embodiments, the metal line 150B may have an interface 178B with the via structure 120B, and the interface 178B extends within a bottom surface 180B of the metal line 150B. In some embodiments, a sidewall surface 182B and an opposing sidewall surface 184B of the via structure 120B (e.g. extending substantially along a X-Z plane) both extend within the perimeter of the metal line 150B (e.g. within the perimeter of the bottom surface 180B). In other words, the width 172B of the via structure 120B is less than the width 174B of the metal line along the Y-direction. These features and dimensions are also illustrated in FIGS. 1B and 1C. Alternatively, in some embodiments, sidewall surface 182B of the via structure 120B extends from the perimeter of the metal line 150B (e.g. the perimeter of the bottom surface 180B); while the sidewall surface 184B of the via structure 120B extends from within the perimeter of the metal line 150B (e.g. within the perimeter of the bottom surface 180B).

As described above, in some embodiments, widths 170A may be greater than the widths 170B; and widths 172A may be similar to widths 172B. Accordingly, the via structures 120A may have a X-Y cross section at the half-height that is greater than the via structures 120B. Moreover, in some embodiments, the interfaces 178A are largely (or entirely) determined by the surface area of the top surface of the via structures 120A; and the interfaces 178B are consistent with the surface area of the top surface of the via structure 120B. In some embodiments, the surface areas of the top surfaces of the via structures 120A and 120B are each similar to their respective cross section area at the half-height. Accordingly, the interfaces 178A may be greater than the interfaces 178B. In some embodiments, a ratio of the surface area of the interface 178A to the surface area of the interface 178B may be between about 1.1:1 to about 12:1. In some embodiments, a ratio of the half-height width 178A to the half-height width 178B of the via trench 118 and/or 118' is about 1.5:1 to about 6:1. Generally, greater contact surface areas (e.g. larger interfaces) leads to smaller contact resistances. Accordingly, the contact resistance between the metal lines 150A and the via structures 120A may be less than the contact resistance between the metal lines 150B and the via structures 120B. Any suitable methods may be used to form the metal lines 150A and 150B. Moreover, the metal lines 150A and the metal lines 150B may be formed in one single step or in separate steps.

Referring to block 222 of FIG. 13, additional steps may be performed to complete the fabrication of the IC device 100. Further, additional steps can be provided before, during, and after the method 200, and some of the steps described can be replaced, relocated, or eliminated for other embodiments of the method 200.

It can be seen from the disclosure above that the IC device 100 has certain characteristics because of the unique process flow of the present disclosure. For example, the via structures 120A on the source side has a dimension 170A along the Y-direction that is substantially greater than the corresponding dimension 170B of the via structures 120B on the drain side. For example, a ratio of dimension 170A to dimension 170B may be about 1.1 to about 12. Moreover, in some embodiments, the metal line 150A connected to the source features has a greater line width 174A than the metal line 150B (having the line width 174B) connected to the drain features. Furthermore, in some embodiments, the via structure 120A has a sidewall surface 182A that matches a sidewall surface 183A of the metal line 150A, while the via structure 120B does not have a sidewall surface that matches with a sidewall surface of the metal line 150B.

Though not intended to be limiting, embodiments of the present disclosure offer benefits for semiconductor processing and semiconductor devices, as compared to conventional devices. For example, the surface area for the interfaces 178A between the via structures 120A and the metal line 150A, as well as the surface area for the interfaces 178B between the via structures 120B and the metal line 150B are individually maximized. Particularly, for example, the interface 178A may have a greater surface area than the interfaces 178B. As described above, contact resistances (which is a function of the surface area of the interfaces) may be more critical on the source side than on the drain side. Accordingly, increasing the size of the interface 178A allows reduction of the overall resistance of the device without overly impeding with the general goal of downsizing. By contrast, in conventional devices, features that connect to the source features and that connect to the drain features typically have similar sizes. For example, metal lines connected to the source features and that connected to the drain features are of similar sizes, and/or via structures connected to the source features and that connected to the drain features are of similar sizes. Accordingly, the sizes of the interfaces between the metal lines and the via structures on the source side and on the drain sides of the conventional devices cannot be independently adjusted. As a result, it becomes challenging to simultaneously optimize the resistance and the feature sizes. Such challenges are mitigated with the methods described herein. Different embodiments may have different advantages, and not all advantages are required for any embodiments.

The present disclosure provides for many different embodiments. An exemplary semiconductor device includes a source feature and a drain feature disposed over a substrate. The semiconductor device further includes a source via electrically coupled to the source feature, and a drain via electrically coupled to the drain feature. The source via has a first size; the drain via has a second size; and the first size is greater than the second size.

In some embodiments, the semiconductor device further includes a source contact between the source via and the source feature, and a drain contact between the drain via and the drain feature. In some embodiments, the source via and the source contact has a first contact surface area, the drain via and the drain contact has a second contact surface area, and the first contact surface area is greater than the second contact surface area. In some embodiments, the semiconductor device further comprises a gate structure between the source feature and the drain feature. The gate structure extends along a first direction. The source via has a first dimension along the first direction, the drain via has a second dimension along the first direction, and a ratio of the first dimension to the second dimension is about 1.1:1 to about 12:1. In some embodiments, the first dimension is in a range between about 3 nm and about 300 nm, and the second dimension is in a range between about 3 nm and about 60 nm. In some embodiments, the semiconductor device further comprises a first metal line and a second metal line. The first metal line is coupled to the source feature by the source via. The second metal line is coupled to the drain feature by the drain via. The first metal line and the source via has a first interface area, the second metal line and the drain via has a second interface area, and the first interface area is greater than the second interface area. In some embodiments, a sidewall surface of the source via vertically extends from a sidewall surface of the first metal line.

An exemplary semiconductor device includes a semiconductor substrate, a gate structure extending over the semiconductor substrate along a first direction, a first source/drain feature on a first side of the gate structure and a second source/drain feature on a second side of the gate structure. The semiconductor device further includes a first contact feature over the first source/drain feature and a second contact feature over the second source/drain feature. Moreover, the semiconductor device includes a first via feature over the first contact feature and a second via feature over the second contact feature. The first via feature has a first dimension along the first direction, the second via feature has a second dimension along the first direction, and the first dimension is different from the second dimension.

In some embodiments, the first source/drain feature is a source feature, the second source/drain feature is a drain feature, and the first dimension is greater than the second dimension. In some embodiments, the first dimension matches a dimension of a metal line overlaying and connected to the first via feature, and the second dimension matches a dimension of a metal line overlaying and connected to the second via feature. In some embodiments, the first dimension is about 3 nm to about 300 nm, and the second dimension is about 3 nm to about 60 nm. In some embodiments, the semiconductor device further comprises a third source/drain feature on the second side of the gate structure. The third source/drain feature is electrically coupled to a third via feature. Moreover, the third source/drain feature is a drain feature, and the third via feature has the second dimension along the first direction. In some embodiments, the semiconductor device further comprises a first metal line coupled to the first via feature and a second metal line coupled to the second via feature. The first metal line has a first line width along the first direction, the second metal line has a second line width along the first direction, and the first line width is greater than the second line width. In some embodiments, a sidewall surface of the first via feature vertically extends from a sidewall surface of the first metal line. The first via feature has a third dimension along a second direction substantially perpendicular to the first direction, the second via feature has a fourth dimension along the second direction, and the fourth dimension is substantially the same as the third dimension. In some embodiments, the first dimension is greater than the third dimension, and the fourth dimension is substantially the same as the second dimension. In some embodiments, the semiconductor device further comprises an interlayer dielectric over the semiconductor substrate and surrounding the first and the second via features. The first and the second via features each directly contacts the interlayer dielectric, and the first and the second via features each includes tungsten (W) or ruthenium (Ru).

An exemplary method includes receiving a semiconductor structure. The semiconductor structure has a source contact feature electrically connected to a source feature on a fin structure and a drain contact feature electrically connected to a drain feature on the fin structure. The method further includes etching a drain via trench over the drain contact feature, depositing to form a drain via in the drain via trench, etching a source via trench over the source contact feature, and depositing to form a source via in the source via trench.

In some embodiments, the method further includes forming a first metal line along a first direction over the drain via and forming a second metal line along the first direction over the source via. The etching of the drain via trench includes etching to form the drain via trench having a first dimension along a second direction perpendicular to the first direction, the etching of the source via trench includes etching to form the source via trench having a second dimension along the second direction. The second dimension is greater than the first dimension. Moreover, the forming of the second metal line includes forming the second metal line having a sidewall surface that vertically extends from a sidewall surface of the source via. In some embodiments, the drain via trench is a first drain via trench, the drain via is a first drain via, the drain contact feature is a first drain contact feature, and the drain feature is a first drain feature. Moreover, the method further includes etching to form a second drain via trench and depositing to form the second drain via after the depositing to form the first drain via and before the etching to form the source via trench. The second drain via trench is formed on a second drain contact feature electrically connected to a second drain feature adjacent the first drain feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a source feature and a drain feature disposed over a substrate;
a source via electrically coupled to the source feature;
a drain via electrically coupled to the drain feature,
a source via metal line disposed over and spanning across the source via; and
a drain via metal line disposed over and spanning across the drain via,
wherein the source via has a first size, the drain via has a second size, and
the first size is greater than the second size,
wherein the source via metal line has a first outer sidewall and a second outer sidewall opposing the first outer sidewall, the first outer sidewall is aligned with a first outermost edge of the source via from a top view, and the second outer sidewall extends past a second outermost edge of the source via from a top view, the second outermost edge opposes the first outermost edge.

2. The semiconductor device of claim 1, further comprising a source contact between the source via and the source feature, and a drain contact between the drain via and the drain feature.

3. The semiconductor device of claim 2, wherein the source via and the source contact has a first contact surface area, the drain via and the drain contact has a second contact surface area, and the first contact surface area is greater than the second contact surface area.

4. The semiconductor device of claim 1, further comprising a gate structure between the source feature and the drain feature, the gate structure extending along a first direction;
wherein the source via has a first dimension along the first direction, the drain via has a second dimension along the first direction, and a ratio of the first dimension to the second dimension is about 1.1:1 to about 12:1.

5. The semiconductor device of claim 4, wherein the first dimension is in a range between about 3 nm and about 300 nm, and the second dimension is in a range between about 3 nm and about 60 nm.

6. The semiconductor device of claim 1, wherein the source via metal line is a first metal line and the drain via metal line is a second metal line, the first metal line coupled to the source feature by the source via, the second metal line coupled to the drain feature by the drain via, wherein the first metal line and the source via has a first interface area, the second metal line and the drain via has a second interface area, and the first interface area is greater than the second interface area.

7. The semiconductor device of claim 6, wherein a sidewall surface of the source via vertically extends from a sidewall surface of the first metal line.

8. A semiconductor device, comprising:
a semiconductor substrate;
a gate structure extending over the semiconductor substrate along a first direction;
a first source/drain feature on a first side of the gate structure and a second source/drain feature on a second side of the gate structure;
a first contact feature over the first source/drain feature and second contact feature over the second source/drain feature; and
a first via feature over the first contact feature and a second via feature over the second contact feature,
wherein the first via feature has a first dimension along the first direction, the second via feature has a second dimension along the first direction, and the first dimension is different from the second dimension,
wherein a portion of the first via feature extends beyond the first source/drain feature and is directly above and directly contacting a portion of an interlayer dielectric (ILD) layer disposed over the semiconductor substrate.

9. The semiconductor device of claim 8, wherein the first source/drain feature is a source feature, the second source/drain feature is a drain feature, and the first dimension is greater than the second dimension.

10. The semiconductor device of claim 9, wherein the first dimension matches a dimension of a metal line overlaying and connected to the first via feature, and the second dimension matches a dimension of a metal line overlaying and connected to the second via feature.

11. The semiconductor device of claim 8, wherein the first dimension is about 3 nm to about 300 nm, and the second dimension is about 3 nm to about 60 nm.

12. The semiconductor device of claim 8, further comprising a third source/drain feature on the second side of the gate structure, the third source/drain feature electrically coupled to a third via feature, wherein the third source/drain feature is a drain feature, and the third via feature has the second dimension along the first direction.

13. The semiconductor device of claim 8, further comprising a first metal line coupled to the first via feature and a second metal line coupled to the second via feature, wherein the first metal line has a first line width along the first direction, the second metal line has a second line width along the first direction, and the first line width is greater than the second line width.

14. The semiconductor device of claim 13, wherein a sidewall surface of the first via feature vertically extends from a sidewall surface of the first metal line.

15. The semiconductor device of claim 8, wherein the first via feature has a third dimension along a second direction substantially perpendicular to the first direction, the second via feature has a fourth dimension along the second direction, and the fourth dimension is substantially the same as the third dimension.

16. The semiconductor device of claim 15, wherein the first dimension is greater than the third dimension, and the fourth dimension is substantially the same as the second dimension.

17. The semiconductor device of claim 8, wherein the interlayer dielectric layer surrounds the first and the second via features, and wherein the first and the second via features each directly contacts the interlayer dielectric layer, and the first and the second via features each includes tungsten (W) or ruthenium (Ru).

18. A semiconductor device, comprising:
source features and drain features disposed over a substrate;
source contacts disposed over the source features;
drain contacts disposed over the drain features;
source vias disposed over the source contacts, each of the source vias having a first width along a first direction and a first length along a second direction perpendicular to the first direction;
drain vias disposed over the drain contacts, each of the drain vias having a second width along the first direction and a second length along the second direction,
a first metal line having a width along the second direction and contacting multiple drain vias by extending along the first direction; and a second metal line having a width along the second direction and contacting multiple source vias by extending along the first direction, wherein the first width is substantially equal to a width of a respective one of the source contacts along the first direction from a top view and the second width is substantially equal to a width of a respective one of the drain contacts along the first direction from the top view, wherein the first width and the second width are substantially the same and a ratio between the first length to the second length is between 1.1 to 12.

19. The semiconductor device of claim 18, wherein a portion of the source vias extends beyond the source contacts along the second direction and contacts an interlayer dielectric (ILD) layer disposed over the substrate.

20. The semiconductor device of claim 18,
wherein a ratio between the width of the second metal line to the width of the first metal line is between 1 to 30.

* * * * *